(12) United States Patent
Liu et al.

(10) Patent No.: US 12,238,998 B2
(45) Date of Patent: Feb. 25, 2025

(54) PIXEL ARRAY WITH PIXEL GROUPS FORMING TRAPEZOIDS

(71) Applicant: BOE Technology Group Co., Ltd., Beijing (CN)

(72) Inventors: Yue Liu, Beijing (CN); Shanshan Bai, Beijing (CN); Weiwei Wang, Beijing (CN); Xinxing Guan, Beijing (CN); Benlian Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 438 days.

(21) Appl. No.: 17/439,940

(22) PCT Filed: Jan. 5, 2021

(86) PCT No.: PCT/CN2021/070308
§ 371 (c)(1),
(2) Date: Sep. 16, 2021

(87) PCT Pub. No.: WO2022/052390
PCT Pub. Date: Mar. 17, 2022

(65) Prior Publication Data
US 2022/0310711 A1  Sep. 29, 2022

(30) Foreign Application Priority Data

Sep. 10, 2020 (WO) ................ PCT/CN2020/114619
Sep. 29, 2020 (WO) ................ PCT/CN2020/118991
Oct. 30, 2020 (WO) ................ PCT/CN2020/125469

(51) Int. Cl.
*H01L 27/32* (2006.01)
*H10K 59/122* (2023.01)
*H10K 59/35* (2023.01)

(52) U.S. Cl.
CPC ......... *H10K 59/353* (2023.02); *H10K 59/122* (2023.02); *H10K 59/352* (2023.02)

(58) Field of Classification Search
CPC .................................................. H10K 59/353
See application file for complete search history.

(56) References Cited

U.S. PATENT DOCUMENTS 10,446,618 B2  10/2019  Wang et al.
10,720,481 B2   7/2020  Xiao et al.
(Continued)

FOREIGN PATENT DOCUMENTS

CN  104282727 A   1/2015
CN  204885167 U  12/2015
(Continued)

OTHER PUBLICATIONS

Office Action dated Apr. 14, 2023 issued in corresponding U.S. Appl. No. 17/850,172.
(Continued)

*Primary Examiner* — Peter Bradford
(74) *Attorney, Agent, or Firm* — Nath, Goldberg & Meyer; Joshua B. Goldberg

(57) ABSTRACT

The disclosure provides a pixel array and a display device. The pixel array includes a plurality of sub-pixels, each of which has a virtual pixel center, the plurality of sub-pixels include first sub-pixels, second sub-pixels, and third sub-pixels; virtual centers of two first sub-pixels and two third sub-pixels are sequentially connected to form a second virtual quadrangle; a first virtual polygon includes four second virtual quadrangles in an array and sharing adjacent sides; and the first sub-pixels and the third sub-pixels are at vertex angles or sides of the first virtual polygon and are alternately on the vertex angles or the sides of the first virtual polygon along a clockwise direction; the first virtual poly-
(Continued)

gon has a first virtual point therein, lines connecting the first virtual point and virtual centers of the four third sub-pixels on the first virtual polygon divide the first virtual polygon into four virtual isosceles trapezoids.

18 Claims, 13 Drawing Sheets

(56)  References Cited

U.S. PATENT DOCUMENTS

| | | | |
|---|---|---|---|
| 11,562,689 | B2 | 1/2023 | Ueno |
| 2005/0248262 | A1 | 11/2005 | Brown Elliott |
| 2013/0113363 | A1 | 5/2013 | Hong |
| 2013/0234917 | A1 | 9/2013 | Lee |
| 2014/0319479 | A1 | 10/2014 | Park et al. |
| 2014/0319484 | A1* | 10/2014 | Kwon .................. H10K 50/813 257/40 |
| 2015/0015465 | A1* | 1/2015 | Gong .................. G09G 3/3208 345/76 |
| 2015/0123952 | A1 | 5/2015 | Kim et al. |
| 2015/0379924 | A1 | 12/2015 | Matsueda et al. |
| 2016/0078807 | A1 | 3/2016 | Sun et al. |
| 2016/0121073 | A1* | 5/2016 | Mok .................... G09G 3/2003 345/694 |
| 2016/0253943 | A1 | 9/2016 | Wang |
| 2017/0194398 | A1 | 7/2017 | Kim et al. |
| 2017/0287988 | A1* | 10/2017 | Lee ........................ H10K 50/19 |
| 2017/0317150 | A1 | 11/2017 | Chung et al. |
| 2018/0088260 | A1 | 3/2018 | Jin et al. |
| 2018/0158887 | A1 | 6/2018 | Yun et al. |
| 2018/0254304 | A1* | 9/2018 | Hong .................. H10K 59/352 |
| 2018/0261654 | A1 | 9/2018 | Hwang et al. |
| 2018/0277040 | A1 | 9/2018 | Lee et al. |
| 2018/0342570 | A1 | 11/2018 | Hong et al. |
| 2019/0140030 | A1 | 5/2019 | Huangfu et al. |
| 2019/0252469 | A1 | 8/2019 | Xiao et al. |
| 2019/0355794 | A1 | 11/2019 | Dai et al. |
| 2019/0363310 | A1* | 11/2019 | Nakamura ............ H10K 71/00 |
| 2019/0393275 | A1 | 12/2019 | Kim et al. |
| 2020/0127060 | A1 | 4/2020 | Li et al. |
| 2020/0168692 | A1 | 5/2020 | Liu et al. |
| 2020/0273924 | A1 | 8/2020 | Xiao et al. |
| 2020/0343318 | A1 | 10/2020 | Li et al. |
| 2020/0357862 | A1 | 11/2020 | Wang et al. |
| 2020/0402442 | A1* | 12/2020 | Liu ............................ G09F 9/33 |
| 2021/0091145 | A1 | 3/2021 | Huangfu et al. |
| 2021/0098539 | A1 | 4/2021 | Zhang et al. |
| 2021/0098540 | A1 | 4/2021 | Chen |
| 2021/0193766 | A1 | 6/2021 | Liu et al. |
| 2021/0335909 | A1 | 10/2021 | Wang et al. |
| 2021/0343800 | A1 | 11/2021 | Zhao |
| 2021/0343801 | A1 | 11/2021 | Wang et al. |
| 2022/0208891 | A1 | 6/2022 | Liu et al. |
| 2022/0310711 | A1 | 9/2022 | Liu et al. |
| 2022/0328573 | A1 | 10/2022 | Hu et al. |
| 2022/0352259 | A1 | 11/2022 | Xue et al. |
| 2023/0006004 | A1 | 1/2023 | Li et al. |
| 2023/0081009 | A1 | 3/2023 | Shi et al. |
| 2023/0087603 | A1 | 3/2023 | Wang et al. |

FOREIGN PATENT DOCUMENTS

| | | | | |
|---|---|---|---|---|
| CN | 205355055 | U | 6/2016 | |
| CN | 106486514 | A | 3/2017 | |
| CN | 107887404 | A | 4/2018 | |
| CN | 207966983 | U | 10/2018 | |
| CN | 207966985 | U | 10/2018 | |
| CN | 207966988 | U | 10/2018 | |
| CN | 207966995 | U | 10/2018 | |
| CN | 108922919 | A | 11/2018 | |
| CN | 208077981 | U * | 11/2018 | ........... C23C 14/042 |
| CN | 109300958 | A | 2/2019 | |
| CN | 109860237 | A | 6/2019 | |
| CN | 109935617 | A | 6/2019 | |
| CN | 208970513 | U | 6/2019 | |
| CN | 109994503 | A | 7/2019 | |
| CN | 110137206 | A | 8/2019 | |
| CN | 110620135 | A | 12/2019 | |
| CN | 111341815 | A | 6/2020 | |
| CN | 111341817 | A | 6/2020 | |
| CN | 111682056 | A | 9/2020 | |
| CN | 111725289 | A | 9/2020 | |
| CN | 112436029 | A | 3/2021 | |
| CN | 112436030 | A | 3/2021 | |
| CN | 112864215 | A | 5/2021 | |
| CN | 111416048 | B | 9/2022 | |
| JP | 2005352140 | A | 12/2005 | |
| WO | 2022/052010 | A1 | 3/2022 | |
| WO | 2022/052834 | A1 | 3/2022 | |
| WO | WO-2022052390 | A1 * | 3/2022 | ......... H01L 27/3218 |

OTHER PUBLICATIONS

Office Action dated Apr. 10, 2023 issued in corresponding Chinese Application No. 202180000017.5.
Office Action dated Apr. 13, 2023 issued in corresponding Japanese Application No. 2021-577081.
Office Action dated Dec. 30, 2022 issued in corresponding U.S. Appl. No. 17/850,172.
Office Action dated Apr. 4, 2023 issued in corresponding Australian Application No. 2020450961.
Extended European Search Report issued on Nov. 29, 2023, for application No. EP 21865889.6.
Extended European Search Report issued on Dec. 8, 2023, for application No. EP 21865575.1.
First Office Action dated Jun. 1, 2021 corresponding to Chinese application No. 202080002174.5.
International Search Report dated Jun. 10, 2021 corresponding to application No. PCT/CN2020/118991.
International Search Report dated Jun. 16, 2021 corresponding to application No. PCT/CN2020/125469.
International Search Report dated Aug. 27, 2021 corresponding to application No. PCT/CN2020/096385.
International Search Report dated Nov. 8, 2021 corresponding to application No. PCT/CN2020/115548.
First Office Action issued on Dec. 12, 2022 for Australian application No. 2020450961.
Office Action issued on Feb. 13, 2024 for Indian application No. 202117060095.
Office Action issued on Feb. 7, 2024 for U.S. Appl. No. 17/439,861.
Office Action issued on Mar. 21, 2024 for U.S. Appl. No. 17/434,877.

* cited by examiner

PIXEL ARRAY WITH PIXEL GROUPS FORMING TRAPEZOIDS

This is a National Phase Application filed under 35 U.S.C. 371 as a national stage of PCT/CN2021/070308, filed Jan. 5, 2021, an application claiming the benefit of Chinese Patent Application No. PCT/CN2020/114619, filed on Sep. 10, 2020, Chinese Patent Application No. PCT/CN2020/118991, filed on Sep. 29, 2020, and Chinese Patent Application No. PCT/CN2020/125469, filed on Oct. 30, 2020, the contents of which are hereby incorporated by reference in its entirety.

TECHNICAL FIELD

The present disclosure relates to the field of display technology, and in particular to a pixel array and a display device.

BACKGROUND

Organic light emitting diode (OLED) display devices are one of hot spots in the research field of current flat panel displays. Compared with liquid crystal displays, OLED display devices have the advantages of low energy consumption, low production cost, self-luminescence, wide viewing angle, fast response speed, and the like. Currently, OLED display devices replace conventional liquid crystal displays (LCDs) in the field of flat panel displays, such as a mobile phone, a tablet computer, a digital camera, and the like.

The OLED display device mainly includes: a substrate; pixels arranged in a matrix on the substrate. In general, each pixel is made of an organic material and is formed through a high-precision metal mask by using an evaporation film forming technology, and an organic light emitting diode device is formed at a corresponding pixel position on an array substrate.

SUMMARY

The present invention is directed to at least solve one of the technical problems of the prior art, and provides a pixel array and a display device.

In a first aspect, an embodiment of the present disclosure provides a pixel array including a plurality of sub-pixels; each sub-pixel has a virtual pixel center, a width direction and a length direction of the sub-pixel are as a width extending direction and a length extending direction of a defining quadrangle, respectively, and a width and a length of the sub-pixel are as a width and a length of the defining quadrangle, respectively, and an intersection of diagonal lines of the defining quadrangle is as the virtual pixel center; the plurality of sub-pixels include first sub-pixels, second sub-pixels, and third sub-pixels; the first sub-pixels and the third sub-pixels are alternately along a first direction to form first pixel groups; the second sub-pixels are side by side along the first direction to form second pixel groups; the first sub-pixels and the third sub-pixels are alternately along a second direction to form third pixel groups; the second sub-pixels are side by side along the second direction to form fourth pixel groups; the first pixel groups and the second pixel groups are alternately along the second direction; the third pixel groups and the fourth pixel groups are alternately along the first direction; wherein, virtual centers of two first sub-pixels and two third sub-pixels in two adjacent first pixel groups and two adjacent third pixel groups are sequentially connected to form a second virtual quadrangle; a first virtual polygon includes four second virtual quadrangles in an array and sharing adjacent sides; and the first sub-pixels and the third sub-pixels are at vertex angles or sides of the first virtual polygon and are alternately on the vertex angles or the sides of the first virtual polygon along the clockwise direction; and the first virtual polygon has a first virtual point therein, lines connecting the first virtual point and virtual centers of the four third sub-pixels on the first virtual polygon divide the first virtual polygon into four virtual isosceles trapezoids.

In some embodiments, the virtual centers of four third sub-pixels in the first virtual polygon are sequentially connected to form a third virtual quadrangle; the first virtual point is on a diagonal line of the third virtual quadrangle; and/or a virtual center of the first sub-pixel within the first virtual polygon is on a diagonal line of the third virtual quadrangle.

In some embodiments, a virtual center of the first sub-pixel within the first virtual polygon is on a center of the third virtual quadrangle.

In some embodiments, the first virtual point within the first virtual polygon and a virtual center of the first sub-pixel are located on a same diagonal line of the third virtual quadrangle.

In some embodiments, the third virtual quadrangle includes a square.

In some embodiments, the third virtual quadrangle has a first side and a second side opposite to each other, and a third side and a fourth side opposite to each other; two second sub-pixels in the virtual isosceles trapezoid and on the first side and the second side are symmetric with respect to a straight line, which passes through a center of the third side and is parallel to the first side, as a symmetry axis; and/or two second sub-pixels located in the virtual isosceles trapezoid and on the third side and the fourth side are symmetric with respect to a straight line, which penetrates through a center of the first side and is parallel to the third side, as a symmetry axis.

In some embodiments, the third virtual quadrangle has a first side and a second side opposite to each other, and a third side and a fourth side opposite to each other; the third virtual quadrangle has a first diagonal line and a second diagonal line; two second sub-pixels in the virtual isosceles trapezoid and on the first side and the third side are symmetric with respect to an extending line of the first diagonal line as a symmetry axis; and/or two second sub-pixels in the virtual isosceles trapezoid and on the second side and the fourth side are symmetric with respect to an extending line of the second diagonal line as a symmetric axis.

In some embodiments, the second sub-pixels in the same second pixel group have different sizes; and/or the second sub-pixels in the same fourth pixel group have different sizes.

In some embodiments, respective second sub-pixels within the same first virtual polygon have a same size.

In some embodiments, the second sub-pixel includes at least one vertex angle, a distance from a vertex of one vertex angle to the virtual center of the second sub-pixel is different from a distance from a vertex of other vertex angle to the virtual center of the second sub-pixel.

In some embodiments, distances between the virtual center of the second sub-pixel in the virtual isosceles trapezoid and the virtual centers of two third sub-pixels on the virtual isosceles trapezoid are substantially same.

In some embodiments, distances between a first sub-pixel in the first pixel group and two third sub-pixels adjacent to the first sub-pixel are different from each other.

In some embodiments, the first virtual point is the virtual center of the first sub-pixel within the first virtual polygon.

In some embodiments, the second sub-pixels include first corners, a distance from a vertex of the first corner of the second sub-pixel to the virtual center of the second sub-pixel is smaller than a distance from a vertex of the opposite angle of the first corner of the second sub-pixel to the virtual center of the second sub-pixel; a line connecting vertexes of first corners of the second sub-pixels in the same fourth pixel group is substantially parallel to the second direction;

first corners of adjacent second sub-pixels in the same second pixel group have different orientations; first corners of adjacent second sub-pixels in the same fourth pixel group have different orientations; and four second pixels in the first virtual polygon are symmetric with respect to a line connecting virtual centers of two third sub-pixels in the third pixel group in the first virtual polygon, as a symmetry axis.

In some embodiments, first corners of adjacent second sub-pixels in the same second pixel group have substantially opposite orientations; first corners of adjacent second sub-pixels in the same fourth pixel group have substantially opposite orientations.

In some embodiments, the first sub-pixels and the third sub-pixels include first corners, a distance from a vertex of the first corner of the first sub-pixel to the virtual center of the first sub-pixel is smaller than a distance from a vertex of the opposite angle of the first corner of the first sub-pixel to the virtual center of the first sub-pixel; a distance from a vertex of the first corner of the third sub-pixel to the virtual center of the third sub-pixel is smaller than a distance from a vertex of the opposite angle of the first corner of the third sub-pixel to the virtual center of the third sub-pixel; and the pixel array includes a plurality of fourth virtual quadrangles which are continuously arranged in the first direction or the second direction, the fourth virtual quadrangle includes one first sub-pixel, one third sub-pixel and two second sub-pixels at the vertex angles of the fourth virtual quadrangle, the first corner of the first sub-pixel and the first corner of the third sub-pixel face to each other, the first corners of the two second sub-pixels face away from each other.

In some embodiments, in the same first pixel group, the first corner of any one first sub-pixel and the first corner of one of two third sub-pixels adjacent to the first sub-pixel face to each other, and the first corner of the first sub-pixel and the other third sub-pixel face away from each other, and a distance between the first sub-pixel and the one of two third sub-pixels is smaller than a distance between the first sub-pixel and the other third sub-pixel.

In some embodiments, the pixel array includes a base substrate, and a pixel definition layer on the base substrate and having a pixel aperture; the sub-pixel includes a first electrode between the base substrate and the pixel definition layer, a light emitting layer covering at least the pixel aperture, and a second electrode covering the light emitting layer; and boundaries of different light emitting layers of the sub-pixels in the same fourth virtual quadrangle are at least partially in contact with each other.

In some embodiments, the pixel array includes a base substrate, and a pixel definition layer on the base substrate and having a pixel aperture; the sub-pixel includes a first electrode between the base substrate and the pixel definition layer, a light emitting layer covering at least the pixel aperture, and a second electrode covering the light emitting layer; and the light emitting layer of the second sub-pixel in any virtual isosceles trapezoid is in a region defined by light emitting layers of two first sub-pixels and light emitting layers of two third sub-pixels at vertex angles of the virtual isosceles trapezoid.

In some embodiments, the pixel array includes a base substrate, and a pixel definition layer on the base substrate and having a pixel aperture; the sub-pixel includes a first electrode between the base substrate and the pixel definition layer, a light emitting layer covering at least the pixel aperture, and a second electrode covering the light emitting layer; and a boundary of the light emitting layer of the second sub-pixel in any virtual isosceles trapezoid is in contact with boundaries of light emitting layers of two third sub-pixels at vertex angles of the virtual isosceles trapezoid.

In some embodiments, the closest distance between pixel apertures of adjacent second sub-pixels is greater than the closest distance between pixel apertures of the first and third sub-pixels adjacent to each other.

In some embodiments, a base angle of the virtual isosceles trapezoid is $\theta$, $45°<\theta<135°$.

In some embodiments, a ratio of the top and bottom sides of the isosceles trapezoid is Pitch+Pitch*cot $\theta$/Pitch−Pitch*cot $\theta$; wherein Pitch is a pixel pitch, which is half of a distance between the virtual centers of the adjacent first sub-pixels in the same first pixel group, or half of a distance between the virtual centers of the adjacent third sub-pixels in the same first pixel group, or a distance between the virtual centers of the adjacent second sub-pixels in the same second pixel group.

In some embodiments, lines connecting virtual centers of the first and third sub-pixels in the same first pixel group are substantially on the same straight line; lines connecting virtual centers of the first sub-pixels in the same third pixel group are substantially on the same straight line, lines connecting virtual centers of the third sub-pixels are substantially on the same straight line, and lines connecting virtual centers of the first sub-pixels and lines connecting virtual centers of the third sub-pixels are not on the same straight line; and/or lines connecting virtual centers of the first sub-pixels and the third sub-pixels in the same third pixel group are substantially on the same straight line; lines connecting virtual centers of the first sub-pixels in the same first pixel group are substantially on the same straight line, lines connecting virtual centers of the third sub-pixels are substantially on the same straight line, and lines connecting virtual centers of the first sub-pixels and lines connecting virtual centers of the third sub-pixels are not on the same straight line.

In some embodiments, distances between the four second sub-pixels in the first virtual polygon to the virtual center of the first sub-pixel within the first virtual polygon are substantially the same.

In a second aspect, an embodiment of the present disclosure provides a display device including any one of the pixel arrays described above.

DETAIL DESCRIPTION OF EMBODIMENTS

Figure 1A:
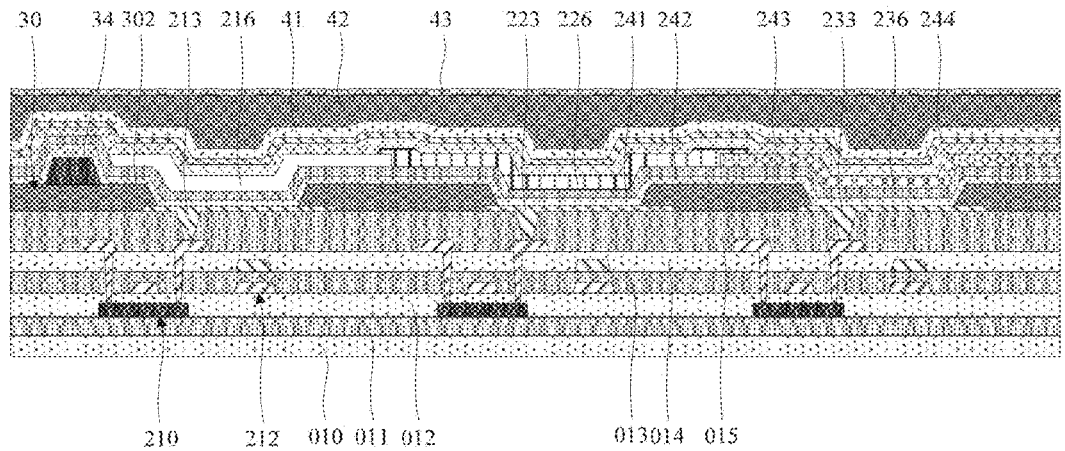
FIG. 1a is a schematic diagram illustrating film layers of an exemplary pixel array.

To enable one of ordinary skill in the art to better understand technical solutions of the present disclosure, the present disclosure will be further described in detail below with reference to the accompanying drawings and exemplary embodiments.

Unless defined otherwise, technical or scientific terms used herein should have the same meaning as commonly understood by one of ordinary skill in the art to which the present disclosure belongs. The terms of "first", "second", and the like herein are not intended to indicate any order, quantity, or importance, but rather are used for distinguishing one element from another. Further, the term of "a", "an", "the", or the like used herein does not denote a limitation of quantity, but rather denotes the presence of at least one element. The term of "comprising", "including", or the like, means that the element or item preceding the term contains the element or item listed after the term and the equivalent thereof, but does not exclude the presence of other elements or items. The terms "connected", "coupled", and the like are not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationship may also be changed accordingly.

Concepts of sub-pixels, a first sub-pixel, a second sub-pixel, a third sub-pixel, and the like, which are mentioned in the following description, will be explained, and then, the pixel array and the display device of the embodiments of the present disclosure will be described. In the embodiments of the present disclosure, the pixel array refers to an arrangement of light emitting devices of different colors in a display substrate, and does not limit an arrangement of pixel circuits for driving respective light emitting devices. Accordingly, it should be understood that the sub-pixels in the embodiments of the present disclosure refer to light emitting device structures, and the first sub-pixel, the second sub-pixel, and the third sub-pixel represent sub-pixels of three different colors, respectively. In the embodiment of the present disclosure, as an example, the first sub-pixel is a red sub-pixel, the second sub-pixel is a green sub-pixel, and the third sub-pixel is a blue sub-pixel, which does not limit the scope of the embodiments of the present disclosure. A first direction and a second direction mentioned in the embodiments of the present disclosure intersect with each other, for example, one of the first direction and the second direction is a row direction, and the other is a column direction. Alternatively, the first direction and the second direction may have any two directions with a certain included angle therebetween. In the embodiment of the present disclosure, as an example, the first direction is a row direction, and the second direction is a column direction.

Generally, a shape of each sub-pixel depends on a pixel aperture in a pixel definition layer, in which a light emitting layer is at least partially formed, i.e., a light emitting layer is at least partially formed in the shape of the sub-pixel mentioned in the embodiments of the present disclosure. The light emitting layer is formed by FMM evaporation, that is, a shape of the light emitting layer depends on a shape of an FMM opening. That is, in the embodiment of the present disclosure, a shape and a size of the light emitting layer are consistent with those of the FMM opening. Therefore, in the following description of the embodiments of the present disclosure, a shape of the pixel aperture represents the shape of the sub-pixel, and a shape of a light emitting region represents the shape of the FMM opening. When the shape of the pixel aperture is quadrangle, the shape of the sub-pixel is quadrangle.

There is a display center (hereinafter referred to as center) for any sub-pixel, which refers to the planar geometric center of the pixel aperture of that sub-pixel. In an embodiment of the present disclosure, each sub-pixel further has a virtual center, and when the shape of the sub-pixel is a regular shape, for example, when the shape of the sub-pixel is regular polygon, circle or ellipse, the virtual center of the sub-pixel is the geometric center of the sub-pixel, that is, the center of the sub-pixel is coincident with the virtual center. When the shape of the sub-pixel is not a regular shape, for example, when at least one vertex angle of the shape (such as a rectangle) of the sub-pixel is different from the shape of other vertex angles, the center of the sub-pixel is not coincident with the virtual center. The virtual center of such a sub-pixel may be determined in such a manner that a width direction and a length direction of the sub-pixel are taken as a width direction and a length direction of a defining quadrangle, respectively, and a width and a length of the sub-pixel are taken as a width and a length of the defining quadrangle, respectively, and an intersection of diagonal lines of the defining quadrangle may be taken as the virtual pixel center of the sub-pixel. The length direction of the sub-pixel (having a polygonal shape, for example) may be the longest line (largest dimension) parallel or perpendicular to one of the sides and through the geometric center thereof. For example, for a shape similar to a rectangle, the length direction is the long side; for a shape similar to a hexagon, the length direction is a length of a connection line perpendicular to a pair of parallel sides and through the center; for a shape similar to a pentagon, the length direction is a length of a connection line perpendicular to a side and connecting opposite angles thereof, and the like; for circular or elliptical, the length direction is the direction of a diameter or a long axis, respectively, and so on; the width direction of the sub-pixel is perpendicular to the length direction.

In addition, the embodiment of the present disclosure will be described by taking an example in which a shape of at least one of the red sub-pixel, the green sub-pixel, and the blue sub-pixel includes a polygon, and the red sub-pixel, the green sub-pixel, and the blue sub-pixel are all polygons in the embodiment of the present disclosure, and the polygons are quadrangles. The polygon may have three or more corners depending on its shape; a pair of vertex angles means that, for example, the polygon includes N vertex angles, and the vertex angles are sequentially sorted from a same vertex angle as a starting point, the 1st vertex angle and the N/2+1 th vertex angle are opposite angles, the 2nd vertex angle and the N/2+2th vertex angle are opposite angles, . . . , and the N/2th vertex angle and the Nth vertex angle are opposite angles. For example, a quadrangle or a quadrangle-like shape includes four vertex angles. Each polygon includes four vertex angles which are respectively a first corner (vertex angle), a second corner, a third corner and a fourth corner. As an example, the first corner and the third corner are disposed opposite to each other, and the second corner and the fourth corner are disposed opposite to each other. It should be understood that if the sub-pixel is a polygon, the number of corners thereof may also be more, and this is not limited in the embodiment of the present disclosure. However, it should be noted that the vertex angle in the present embodiment is not necessarily an included angle between two lines, and actually, a portion where two edges forming a certain vertex angle extend to a vertex thereof and meet may be formed as an arc line segment or a straight line segment so that the vertex angle becomes a round chamfer or a flat chamfer. In order to clarify the structure of each sub-pixel in the pixel array in the embodiment of the present disclosure, respective layers of the pixel array in the embodiment of the present disclosure are described in combination with the manufacturing method for the pixel array. In order to clarify the structure of each sub-pixel in the pixel array in the embodiment of the present disclosure, respective layers of the pixel array in the embodiment of the present disclosure are described in combination with the manufacturing method for the pixel array. FIG. 1a is a schematic diagram illustrating respective layers of an exemplary pixel array. As shown in FIG. 1a, the method specifically may include steps of:

(1) forming a base substrate on a glass carrier plate.

Figure 6:
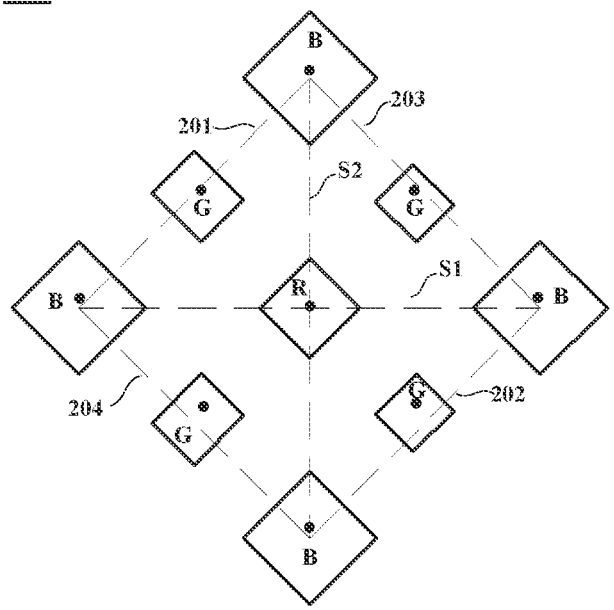
FIG. 6 is a schematic diagram of an arrangement of sub-pixels in a third virtual quadrangle in the first virtual polygon of FIG. 4.

In some exemplary embodiments, the base substrate 10 may be a flexible base substrate, for example, including a first flexible material layer, a first inorganic material layer, a semiconductor layer, a second flexible material layer, and a second inorganic material layer stacked on the glass carrier plate. The first flexible material layer and the second flexible material layer are made of polyimide (PI), polyethylene terephthalate (PET) or a polymer soft film subjected to a surface treatment. The first inorganic material layer and the second inorganic material layer are made of silicon nitride (SiNx) or silicon oxide (SiOx) and the like, and are used for improving the water and oxygen resistance of the base substrate, and the first inorganic material layer and the second inorganic material layer are also called barrier layers. The material of the semiconductor layer is amorphous silicon (a-Si). In some exemplary embodiments, by taking a stacked structure PI1/Barrier1/a-Si/PI2/Barrier2 as an example, the manufacturing procedure includes: firstly, coating a layer of polyimide on the glass carrier plate 1, to form a first flexible (PI1) layer after curing the layer of polyimide; subsequently, depositing a barrier film on the first flexible layer to form a first barrier (Barrier1) layer covering the first flexible layer; then, depositing an amorphous silicon film on the first barrier layer to form an amorphous silicon (a-Si) layer covering the first barrier layer; then, coating a layer of polyimide on the amorphous silicon layer, to form a second flexible (PI2) layer after curing the layer of polyimide; then, depositing a barrier film on the second flexible layer to form a second barrier (Barrier 2) layer covering the second flexible layer. At this time, the manufacturing of the base substrate 10 has been completed, as shown in FIG. 6.

(2) forming a driving structure layer on the base substrate.
The driving structure layer includes a plurality of driving circuits, each of which includes a plurality of transistors and at least one storage capacitor, for example, a 2T1C, 3T1C or 7T1C design. Three sub-pixels are taken as an example for illustration, and the driving circuit of each sub-pixel only including one transistor and one storage capacitor is taken as an example for illustration.

In some embodiments, the manufacturing procedure for the driving structure layer may refer to the following description. The manufacturing procedure for the driving circuit of the red sub-pixel will be described as an example.

The method includes the steps of sequentially depositing a first insulating film and an active layer film on the base substrate 10, and patterning the active layer film through a patterning process to form a first insulating layer 011 covering the whole base substrate 010 and an active layer pattern arranged on the first insulating layer 011, such that the active layer pattern at least includes a first active layer.

Subsequently, a second insulating film and a first metal film are sequentially deposited, and the first metal film is patterned through a patterning process to form a second insulating layer 012 covering the active layer pattern, and a first gate metal layer pattern disposed on the second insulating layer 012, such that the first gate metal layer pattern includes at least a first gate and a first capacitor electrode.

Subsequently, a third insulating film and a second metal film are sequentially deposited, and the second metal film is patterned through a patterning process to form a third insulating layer 013 covering the first gate metal layer and a second gate metal layer pattern disposed on the third insulating layer 013, wherein the second gate metal layer pattern at least includes a second capacitor electrode, which is arranged at a position corresponding to a position of the first capacitor electrode.

Subsequently, a fourth insulating film is deposited and patterned through a patterning process to form a pattern of a fourth insulating layer 014 covering the second gate metal layer, such that the fourth insulating layer 014 is provided with at least two first vias formed by etching away parts of the fourth insulating layer 014, the third insulating layer 013 and the second insulating layer 012 at the at least two first vias to expose a surface of the first active layer.

Subsequently, a third metal film is deposited and patterned through a patterning process, and a source-drain metal layer pattern is formed on the fourth insulating layer 014, wherein the source-drain metal layer pattern at least includes a first source and a first drain which are located in the display region. The first source and the first drain may be connected to the first active layer through the first vias, respectively.

In the driving circuit of the red sub-pixel of the display region, the first active layer, the first gate, the first source, and the first drain may constitute a first transistor 210, and the first capacitor electrode and the second capacitor electrode may constitute a first storage capacitor 212. In the above manufacturing procedure, the driving circuit of the green sub-pixel and the driving circuit of the blue sub-pixel may be simultaneously formed.

In some exemplary embodiments, the first insulating layer 011, the second insulating layer 012, the third insulating layer 013, and the fourth insulating layer 014 may be a single layer, a multi-layer, or a composite layer made of any one or more of silicon oxide (SiOx), silicon nitride (SiNx), and silicon oxynitride (SiON). The first insulating layer 011 is called a buffer layer and is used for improving the water and oxygen resistance of the base substrate, the second insulating layer 012 and the third insulating layer 013 are called gate insulator (GI) layers; the fourth insulating layer 014 is called an interlayer dielectric (ILD) layer. The first metal film, the second metal film and the third metal film are made of a metal material, such as any one or more of silver (Ag), copper (Cu), aluminum (Al), titanium (Ti) and molybdenum (Mo), or an alloy material of the above metals, such as aluminum neodymium alloy (AlNd) or molybdenum niobium alloy (MoNb), and may be a single-layer structure or a multi-layer composite structure, such as Ti/Al/Ti, or the like. The active layer film is made of one or more of amorphous indium gallium zinc oxide materials (a-IGZO), zinc oxynitride (ZnON), indium zinc tin oxide (IZTO), amorphous silicon (a-Si), polycrystalline silicon (p-Si), hexathiophene, polythiophene and the like, and the present disclosure is applicable to transistors manufactured based on oxide technology, silicon technology and organic technology.

(3) forming a planarization layer on the base substrate with the above patterns.

In some exemplary embodiments, a planarization film of an organic material is coated on the base substrate 010 on which the aforementioned patterns are formed, such that a planarization (PLN) layer 015 covering the entire base substrate 010 is formed, and a plurality of second vias are formed in the planarization layer 015 of the display region through a mask plate, and exposure and development processes. A development process is performed on the planarization layer 015 in the plurality of second vias to expose a surface of the first drain of the first transistor 210 of the driving circuit of the red sub-pixel, a surface of the first drain of the first transistor of the driving circuit of the green sub-pixel, and a surface of the first drain of the first transistor of the driving circuit of the blue sub-pixel 03, respectively.

(4) forming a first electrode pattern on the base substrate with the above patterns. In some examples, the first electrode is a reflective anode.

In some exemplary embodiments, a conductive film is deposited on the base substrate 010 on which the patterns are formed, and is patterned through a patterning process to form a first electrode pattern. A first anode 213 of the red sub-pixel is connected to the first drain of the first transistor 210 through a second via, a second anode 223 of the green sub-pixel 2 is connected to the first drain of the first transistor of the green sub-pixel through a second via, and a third anode 233 of the blue sub-pixel 23 is connected to the first drain of the first transistor of the blue sub-pixel through a second via.

In some examples, the first electrode may be made of a metal material, such as one or more of magnesium (Mg), silver (Ag), copper (Cu), aluminum (Al), titanium (Ti), and molybdenum (Mo), or an alloy material of the above metals, such as aluminum neodymium alloy (AlNd) or molybdenum niobium alloy (MoNb), and may have a single-layer structure, or a multi-layer composite structure, such as Ti/Al/Ti, or the like, or may have a stack structure made of a metal and a transparent conductive material, such as a reflective material (such as ITO/Ag/ITO, Mo/AlNd/ITO, or the like).

(5) forming a pixel definition layer (PDL) pattern on the base substrate with the patterns.

Figure 12:
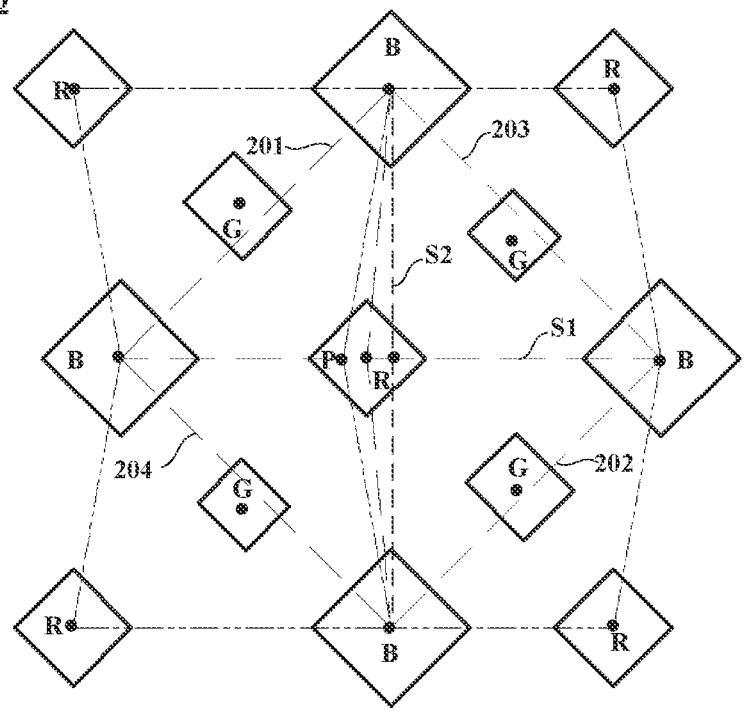
FIG. 12 is a schematic diagram of an arrangement of sub-pixels in a first virtual polygon according to an embodiment of the present disclosure.

In some exemplary embodiments, a pixel definition film is coated on the base substrate 010 on which the patterns are formed, and a pixel definition layer pattern is formed through a mask plate and exposure and development processes. As shown in FIG. 12, the pixel definition layer 30 of the display region includes a plurality of sub-pixel definition portions 302, a plurality of pixel openings 301 are formed between adjacent sub-pixel definition portions 302, and a development process is performed on the pixel definition layer 30 in the plurality of pixel openings 301 to expose at least a portion of the surface of the first anode 213 of the red sub-pixel, at least a portion of the surface of the second anode 223 of the green sub-pixel, and at least a portion of the surface of the third anode 233 of the blue sub-pixel, respectively.

In some examples, the pixel definition layer 30 may be made of polyimide, acryl, polyethylene terephthalate, or the like.

(6) forming a pattern of a post spacer (PS) on the base substrate with the patterns.

In some exemplary embodiments, an organic material film is coated on the base substrate 010 on which the patterns are formed, a pattern of a post spacer 34 is formed through a mask plate and exposure and development processes. The post spacer 34 may serve as a support layer configured to support an FMM (fine metal mask) during an evaporation process. In some examples, two adjacent post spacers 34 are spaced apart by one repeating unit along a row arrangement direction of the sub-pixels. For example, the post spacer 34 may be located between the red sub-pixel and blue sub-pixel 03 adjacent to each other.

(7) sequentially forming organic functional layers and a second electrode on the base substrate on which the patterns are formed. In some examples, the second electrode is a transparent cathode. A light emitting element can emit light from a side distal to the base substrate 010 through the transparent cathode, thereby realizing top emission. In some examples, the organic functional layers of the light emitting element include: a hole injection layer, a hole transport layer, a light emitting layer, and an electron transport layer.

In some exemplary embodiments, the hole injection layer 241 and the hole transport layer 242 are sequentially formed on the base substrate 010 on which the patterns are formed, by using an open mask through an evaporation process; and then, a blue light emitting layer 236, a green light emitting layer 216, and a red light emitting layer 226 are sequentially formed by using the FMM through an evaporation process; and then, the electron transport layer 243, the cathode 244, and an optical coupling layer 245 are sequentially formed by using an open mask through an evaporation process. The hole injection layer 241, the hole transport layer 242, the electron transport layer 243, and the cathode 244 are all common layers of the plurality of sub-pixels. In some examples, the organic functional layers may further include: a microcavity adjusting layer between the hole transport layer and the light emitting layer. For example, after the hole transport layer is formed, a blue microcavity adjusting layer, the blue light emitting layer, a green microcavity adjusting layer, the green light emitting layer, a red microcavity adjusting layer, and the red light emitting layer may be sequentially formed by using the FMM through an evaporation process.

Figure 1B:
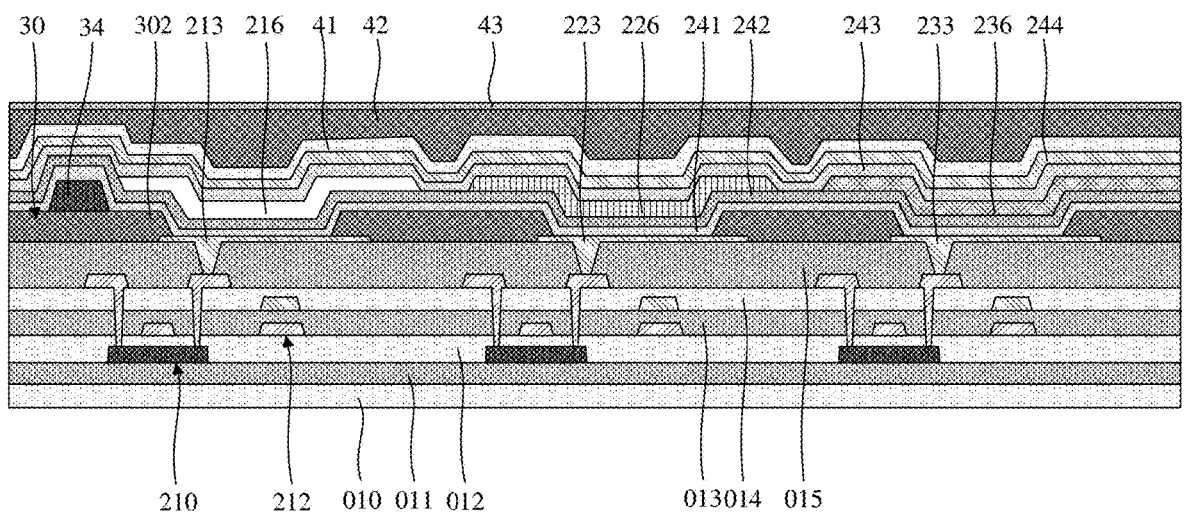
FIG. 1b is a schematic diagram illustrating film layers of an exemplary pixel array.

In some exemplary embodiments, as shown in FIG. 1a, there may be overlap between any two adjacent ones of the blue light emitting layer 236, the green light emitting layer 216, and the red light emitting layer 226 formed by evaporation due to limitation of FMM openings. FIG. 1b is a schematic diagram of another exemplary film structure of a pixel array. As may be seen from FIG. 1b, there may be no overlap between any two adjacent ones of the blue light emitting layer 236, the green light emitting layer 216, and the red light emitting layer 226. That is, sizes of the light emitting layers formed by using FMMs with different opening sizes are different. In some exemplary embodiments, organic functional layers are formed in the sub-pixel region, enabling the organic functional layers to be connected to the anode. The cathode is formed on the pixel definition layer and connected to the organic functional layers.

In some exemplary embodiments, the cathode may be made of any one or more of magnesium (Mg), silver (Ag), aluminum (Al), or an alloy material of any one or more of the above metals, or a transparent conductive material, such as indium tin oxide (ITO), or a multi-layer composite structure of a metal and a transparent conductive material.

In some exemplary embodiments, the optical coupling layer may be formed on a side of the cathode 244 distal to the base substrate 10, and may be a common layer of the plurality of sub-pixels. The optical coupling layer may cooperate with the transparent cathode to increase light output. For example, the material of the optical coupling layer may be a semiconductor material. However, the present embodiment is not limited to this.

(8) forming an encapsulation layer on the base substrate with the patterns.

In some exemplary embodiments, an encapsulation layer is formed on the base substrate 010 on which the patterns are formed, and may include a first encapsulation layer 41, a second encapsulation layer 42, and a third encapsulation layer 43 that are stacked. The first encapsulation layer 41 is made of an inorganic material and covers the cathode 244 in the display region. The second encapsulation layer 42 is made of an organic material. The third encapsulation layer 43 is made of an inorganic material, and covers the first encapsulation layer 41 and the second encapsulation layer 42. However, the present embodiment is not limited to this. In some examples, the encapsulation layer may be made of an inorganic/organic/inorganic/organic/inorganic five-layer structure.

Figure 2:
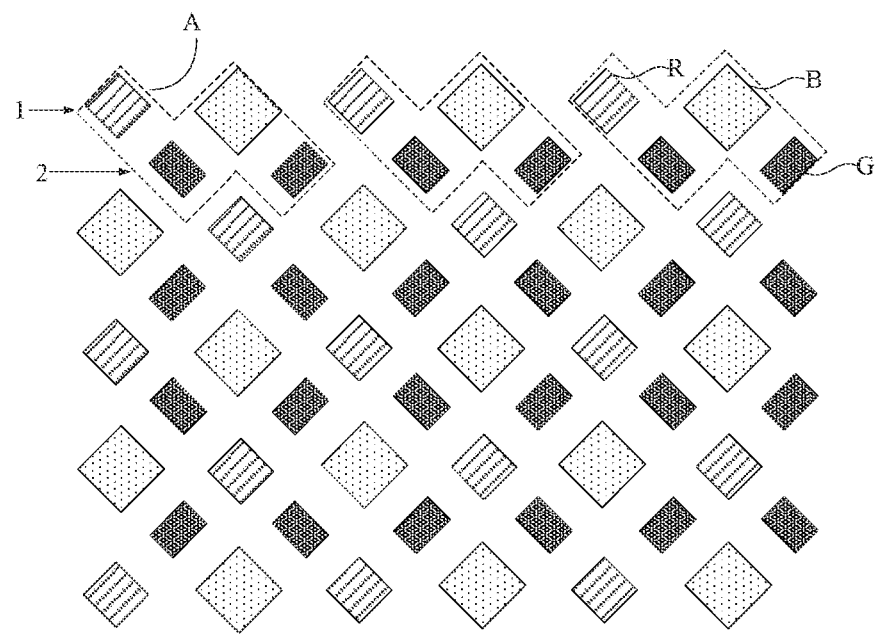
FIG. 2 illustrates a schematic diagram of an exemplary pixel array.

FIG. 2 illustrates a schematic diagram of an exemplary pixel array. As shown in FIG. 2, the pixel array includes a plurality of first pixel groups 1 arranged in rows and a plurality of second pixel groups 2 arranged in rows, and the first pixel groups 1 and the second pixel groups 2 are alternately arranged. The first pixel group 1 is formed by alternately arranging red sub-pixels R and blue sub-pixels B, and the red sub-pixels R and the blue sub-pixels B in the plurality of the first pixel groups 1 in a same column are also alternately arranged. The second pixel group 2 is formed by a plurality of green sub-pixels G arranged side by side, and the green sub-pixels G are arranged in an interleaved manner with the red sub-pixels R and the blue sub-pixels B in adjacent rows. For such a pixel arrangement, the pixel array may be divided into repeating units arranged in an array, each repeating unit includes sub-pixels in two rows and four columns. That is, each repeating unit includes one red sub-pixel R, one blue sub-pixel B. and two green sub-pixels G, wherein the red sub-pixel R and the blue sub-pixel B are shared sub-pixels, and the four sub-pixels can realize the display of 2 virtual pixel units through a virtual algorithm. For example, the red sub-pixel R in a second repeating unit in a first row, the blue sub-pixel B in a first repeating unit in the first row and the green sub-pixel G closest to the blue sub-pixel B form a virtual pixel unit, while the red sub-pixel R in the second repeating unit in the first row, the blue sub-pixel B in the repeating unit and the green sub-pixel G closest to the blue sub-pixel form a virtual pixel unit. In addition, the blue sub-pixel B in the second repeating unit in the first row, the other green sub-pixel G in the repeating unit and the red sub-pixel R in a third repeating unit in the first row closest to the green sub-pixel form a virtual pixel unit, so that the resolution of a display panel having the pixel array can be effectively improved.

Figure 3:
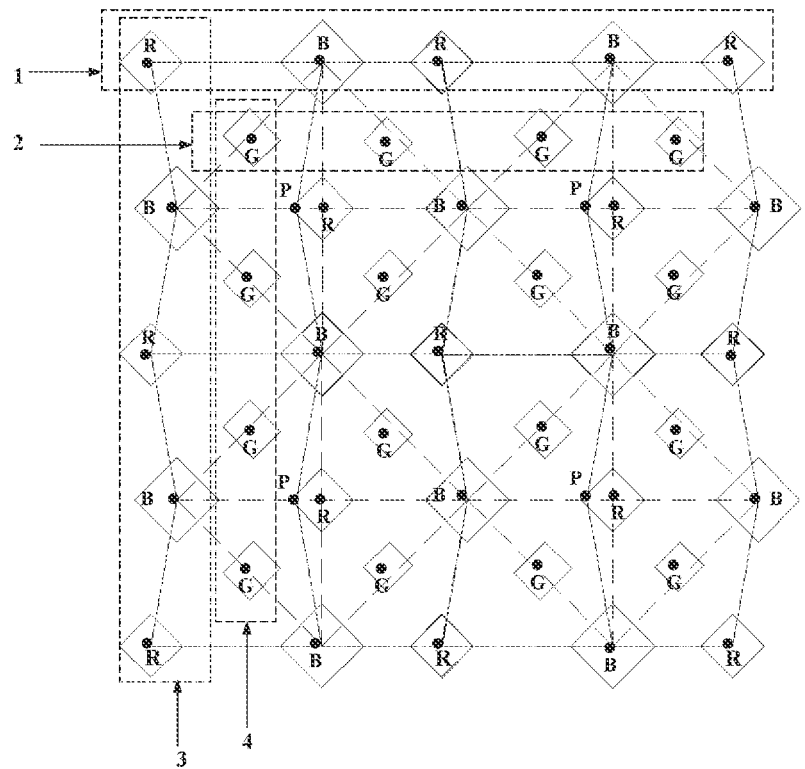
FIG. 3 is a schematic diagram of a pixel array according to an embodiment of the present disclosure.
Figure 4:
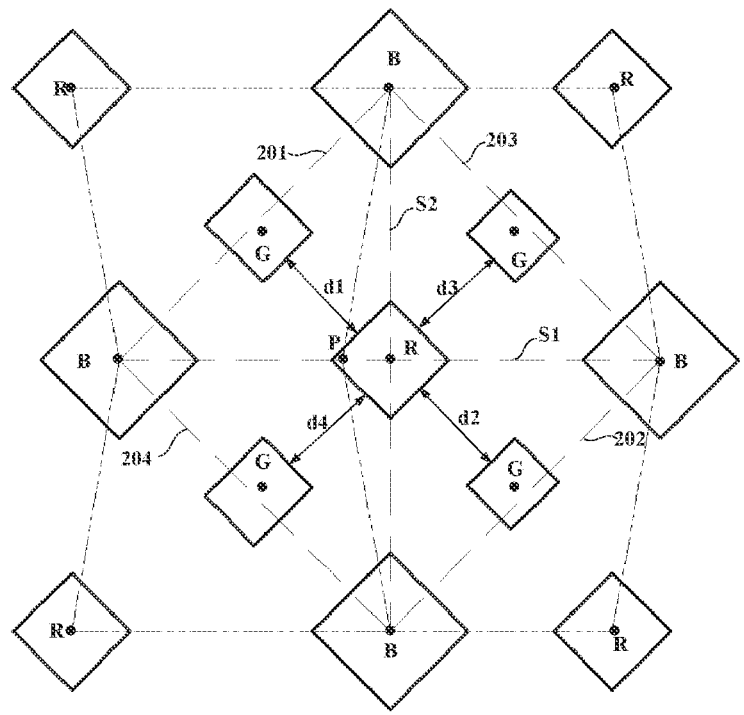
FIG. 4 is a schematic diagram of an arrangement of sub-pixels in a first virtual polygon according to an embodiment of the present disclosure.
Figure 5:
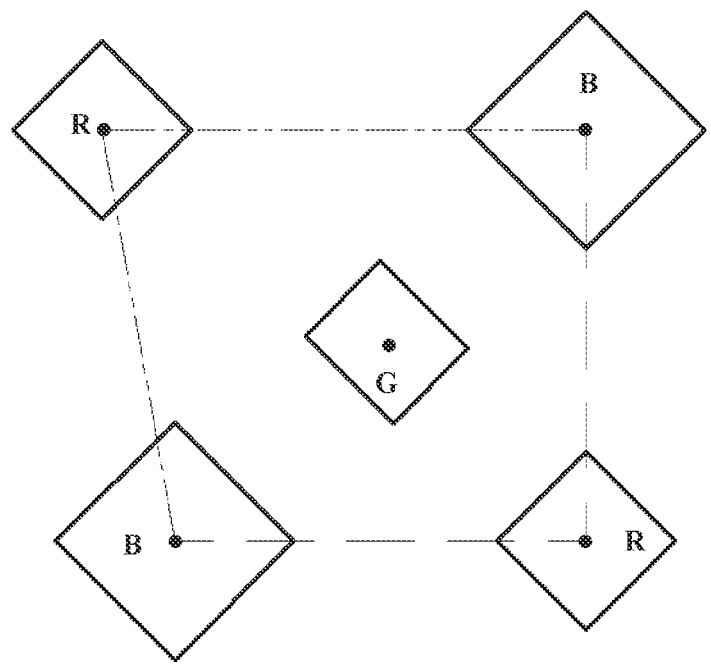
FIG. 5 is a schematic diagram of an arrangement of sub-pixels in a second virtual quadrangle in the first virtual polygon of FIG. 4.
Figure 7:
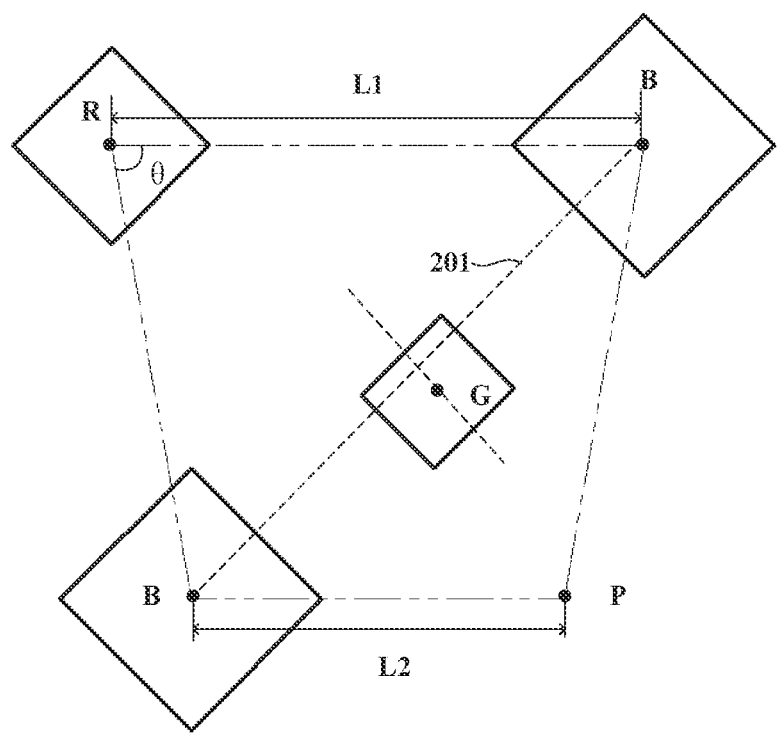
FIG. 7 is a schematic diagram of an arrangement of sub-pixels in a virtual isosceles trapezoid in the first virtual polygon of FIG. 4.

In a first aspect, FIG. 3 is a schematic diagram of a pixel array according to an embodiment of the present disclosure. FIG. 4 is a schematic diagram of an arrangement of sub-pixels in a first virtual polygon according to an embodiment of the present disclosure. FIG. 5 is a schematic diagram of an arrangement of sub-pixels in a second virtual quadrangle in the first virtual polygon of FIG. 4. FIG. 6 is a schematic diagram of an arrangement of sub-pixels in a third virtual quadrangle in the first virtual polygon of FIG. 4. FIG. 7 is a schematic diagram of an arrangement of sub-pixels in a virtual isosceles trapezoid 300 in the first virtual polygon of FIG. 4. As shown in FIGS. 3 to 7, an embodiment of the present disclosure provides a pixel array including a plurality of sub-pixels, where the plurality of sub-pixels includes a red sub-pixel R, a green sub-pixel G, and a blue sub-pixel B.

With continued reference to FIG. 3, the red sub-pixels R and the blue sub-pixels B in the pixel array are alternately arranged in the row direction to form a first pixel group 1; the green sub-pixels G are arranged at intervals in the row direction to form a second pixel group 2; the red sub-pixels R and the blue sub-pixels B are alternately arranged in the column direction to form a third pixel group 3; the green sub-pixels G are arranged at intervals in the column direction to form a fourth pixel group 4. The first pixel groups 1 and the second pixel groups 2 are alternately arranged in the column direction; the third pixel groups 3 and the fourth pixel groups 4 are alternately arranged in the row direction. In the embodiment of the present disclosure, virtual centers of two red sub-pixels R and two blue sub-pixels B in two adjacent first pixel groups 1 and two adjacent third pixel groups 2 are sequentially connected to form a second virtual quadrangle 100, and any two adjacent second virtual quadrangles 100 share an adjacent side. The adjacent side may be, for example, a line connecting virtual centers of the red sub-pixel R and the blue sub-pixel B adjacent to each other in the first pixel group 1, or a line connecting virtual centers of the red sub-pixel R and the blue sub-pixel B adjacent to each other in the third pixel group 3. One green sub-pixel G is provided in each second virtual quadrangle 100. The four second virtual quadrangles 100 arranged in an array form a first virtual polygon 10 in a manner of sharing adjacent sides. For example: referring to FIG. 5, in the embodiment of the present disclosure, one first virtual polygon 10 includes 13 sub-pixels, where 8 sub-pixels are located at edges of the first virtual polygon 10, including 4 red sub-pixels R and 4 blue sub-pixels B; the 5 sub-pixels are located in the first virtual polygon, including 1 red sub-pixel R and 4 green sub-pixels G, respectively. In addition, as may be seen from FIG. 5, the first virtual polygon 10 may be a hexagon, and is a concave hexagon, having three sets of parallel sides, wherein the longest set of parallel sides is parallel to the row direction or the column direction. The four virtual isosceles trapezoids 300 are symmetrical, e.g., longitudinally symmetrical, with respect to one of the longest sides of the hexagon.

In the embodiment of the present disclosure, a first virtual point P exists in the first virtual polygon 10, and lines connecting the first virtual point P and the four blue sub-pixels B divide the first virtual polygon 10 into four virtual isosceles trapezoids 300.

It should be noted that the virtual isosceles trapezoid 300 in the embodiment of the present disclosure is not an isosceles trapezoid in a strict sense, and any trapezoid with a difference between two base angles being within 10° is considered as the so-called isosceles trapezoid in the embodiment of the present disclosure.

In the embodiment of the present disclosure, the red sub-pixels R, the green sub-pixels G, and the blue sub-pixels B are provided such that the display effect of the display device of the embodiment of the present disclosure may be effectively improved, the display fineness is improved, and the edge jaggy feeling and the display graininess are reduced.

In some embodiments, areas of the red sub-pixel R and the blue sub-pixel B are larger than an area of the green sub-pixel G, so that the lifetime of the display device may be improved.

In some embodiments, the third virtual quadrangle 200 formed by connecting the virtual centers of the four blue sub-pixels B in one first virtual polygon 10 includes, but is not limited to, a square, and may also be a diamond, a parallelogram, etc. In the embodiment of the present disclosure, the third virtual quadrangle 200 is illustrated as a square. A first side 201 and a second side 202 of the third virtual quadrangle 200 are opposite to each other, a third side 203 and a fourth side 204 are opposite to each other, and two diagonal lines of the third virtual quadrangle 200 are S1 and S2, respectively.

It should be noted that in the embodiment of the present disclosure, four sides of the third virtual quadrangle 200 are connected end to end in the counterclockwise order of the first side 201, the third side 203, the second side 202, the fourth side 204, or in the clockwise order of the first side 201, the fourth side 204, or the second side 202, the third side 203, to form the quadrangle.

In some examples, the green sub-pixels G in the pixel array have two sizes; specifically, the green sub-pixels G in odd columns (odd fourth pixel groups 4) have the same size, and the green sub-pixels G in even columns (even fourth pixel groups 4) have the same size; alternatively, in the same column (of fourth pixel group), the green sub-pixels G in each odd row have the same size, and the green sub-pixels G in each even row have the same size.

In some examples, a ratio between two sizes of the four-green sub-pixels G in the pixel array is 0.5 to 2. Further, a ratio between two sizes of green sub-pixels G is 0.7 to 1.5.

In some examples, the four green sub-pixels G within the same first virtual polygon 10 have the same size. Alternatively, in the embodiment of the present disclosure, all the green sub-pixels G in the pixel array may have the same size, which facilitates to form the green sub-pixels G.

In some embodiments, as shown in FIG. 4, the virtual centers of the red sub-pixels R in the first virtual polygon 10 may be located at a center of the third virtual quadrangle 200, i.e., at an intersection of S1 and S2. In some embodiments, the virtual centers of the red sub-pixels R in the first virtual polygon 10 may not be located at the center of the third virtual quadrangle, for example, at any position on S1 and S2 except center points of S1 and S2.

In some embodiments, when lines connecting virtual centers of the red sub-pixels R and the blue sub-pixels B in the first pixel group 1 are substantially on a same straight line, the virtual centers of the red sub-pixels R and the first virtual point P within the first virtual polygons 10 are both located on S1. Alternatively, when lines connecting virtual centers of the red sub-pixels R and the blue sub-pixels B in the third pixel group 3 are substantially on a same straight line, the virtual centers of the red sub-pixels R and the first virtual point P within the first virtual polygons 10 are both located on S2.

In some embodiments, a distance from a vertex of a first corner of at least one of the red, green, and blue sub-pixels R, G, and B to the virtual center is different from a distance from the opposite angle of the first corner to the virtual center. For example, the distance from the vertex of the first corner of at least one of the red, green, and blue sub-pixels R, G, and B to the virtual center is smaller than the distance from the opposite angle of the first corner to the virtual center. The first corners of the red, green and blue sub-pixels R, G and B may be round chamfer or a flat chamfer.

In some embodiments, a distance between the red sub-pixel R and one of the blue sub-pixels B adjacent to the red sub-pixel R are not equal to a distance between the red sub-pixel R and the other blue sub-pixel B in the first pixel group 1, so as to increase the pixel aperture ratio.

In some examples, to ensure that sub-pixels are more compact, the aperture ratio may be effectively increased. A distance between a light emitting region and an pixel aperture of each sub-pixel is provided to be approximately 5 μm to 20 μm, and further approximately 8 μm to 18 μm; in some examples, a distance between pixel apertures of two of the sub-pixels of the same color is approximately 5 μm to 20 μm, and further approximately 8 μm to 18 μm. For example, a distance between two red sub-pixels R in the same row is approximately 10 μm to 20 μm. Accordingly, in some examples, a distance between light emitting regions of two sub-pixels of the same color is approximately 5 μm to 20 μm, further approximately 8 μm to 18 μm, further approximately 1 μm to 5 μm. The distance between the light emitting regions of the sub-pixels, the distance between the pixel apertures, and the distance between the light emitting region and the pixel aperture may be further set according to the requirements on the panel size, the resolution and the aperture ratio. In some embodiments, as shown in FIG. 7, top and bottom sides of the virtual isosceles trapezoid 300 are L1 and L2, respectively, a base angle of the virtual isosceles trapezoid 300 is θ, 45°<θ<135°; L1=Pitch+Pitch*cot θ; L2=Pitch−Pitch*cot θ, i.e., L1/L2=Pitch+Pitch*cot θ/Pitch−Pitch*cot θ; where Pitch is a pixel pitch, which is half of a distance between the virtual centers of the adjacent red sub-pixels R in the same first pixel group 1 (or third pixel group 3), or half of a distance between the virtual centers of the adjacent blue sub-pixels B in the same first pixel group 1 (or third pixel group 3), or a distance between the virtual centers of the adjacent green sub-pixels G in the same second pixel group 2 (fourth pixel group 4). The pixel pitch is, for example, half of a distance between the virtual centers of the pixel apertures in two adjacent red sub-pixels R in the row direction. In some examples, the pixel pitch is, for example, approximately a size of a pixel driving circuit for 2 sub-pixels in the row direction. In some examples, the pitch is approximately a size of a pixel driving circuit for 1 sub-pixel in the column direction. In some examples, the pixel pitch is substantially equal to a size of a display region in the row direction divided by the number of pixels in the row direction, or a size of a display region in the column direction divided by the number of pixels in the column direction. For example, for QHD (Quarter High Definition) products, the resolution is 960×540, the pixel pitch is substantially equal to a size of a display region in the row direction divided by 960, or a size of a display region in the column direction divided by 540. For HD (High Definition) products, the pixel pitch is substantially equal to a size of a display region in the row direction divided by 1280, or a size of a display region in the column direction divided by 720. For FHD (Full High Definition) products, the pixel pitch is substantially equal to a size of a display region in the row direction divided by 1920, or a size of a display region in the column direction divided by 1080. For QHD (Quad High Definition) products, the pixel pitch is substantially equal to a size of a display region in the row direction divided by 2560, or a size of a display region in the column direction divided by 1440. For UHD (Ultra High Definition) products, the pixel pitch is substantially equal to a size of a display region in the row direction divided by 3840, or a size of a display region in the column direction divided by 2160.

Respective sub-pixels in the first virtual polygon 10 are explained below with reference to a specific example.

In one example, as shown in FIG. 4, each of the red, green, and blue sub-pixels R, G, and B is a quadrangle (e.g., a square, a rectangle, etc.), and in this case, the virtual centers of the red, green, and blue sub-pixels R, G, and B are the respective centers (the intersection of the diagonals). Centers of two red sub-pixels R and two blue sub-pixels B which are arranged in an array are sequentially connected to form a second virtual quadrangle 100, and any two adjacent second virtual quadrangles 100 share the same edge. One green sub-pixel G is provided in each second virtual quadrangle 100. Four second virtual quadrangles 100 arranged in an array form a first virtual polygon 10. As shown in FIG. 4, centers of the red sub-pixels R and the blue sub-pixels B located in the same row on the first virtual polygon 10 are substantially on the same straight line, and the first virtual polygon 10 is a hexagon. A first virtual point P exists in the first virtual polygon 10, and is located on the S1, and lines connecting the first virtual point P and the four blue sub-pixels B divide the first virtual polygon 10 into four virtual isosceles trapezoids 300.

With continued reference to FIG. 6, lines successively connecting centers of the four blue sub-pixels B on the first virtual polygon 10 form a third virtual quadrangle 200, which includes, but is not limited to, a square. The third virtual quadrangle 200 will be described as a square in the embodiment of the present disclosure. Two diagonal lines of the third virtual quadrangle 200 are S1 and S2, respectively, and the first virtual point P is located on S1. The red sub-pixel R within the first virtual polygon 10 is located at a center of the third virtual quadrangle 200, i.e., at the intersection of S1 and S2. With reference to FIG. 7, one green sub-pixel G is disposed in one virtual isosceles trapezoid 300, and the green sub-pixels G in the same column (the second pixel group 2) have the same size, and the green sub-pixels G in the same row (the fourth pixel group 4) have different sizes. However, distances between the four green sub-pixels G and the red sub-pixel R in the first virtual polygon 10 are equal to each other, i.e. d1=d2=d3=d4. Alternatively, the distances between the four green sub-pixels G and the red sub-pixel R in the first virtual polygon 10 may be different from each other. A center of the blue sub-pixel B in each virtual isosceles trapezoid 300 is located on the perpendicular bisector of a line connecting the centers of the two blue sub-pixels B on the virtual isosceles trapezoid 300. That is, a center of the green sub-pixel G within the virtual isosceles trapezoid 300 located at the upper left corner is located on the perpendicular bisector of the first side 201; a center of the green sub-pixel G in the virtual isosceles trapezoid 300 located at the lower right corner is located on the perpendicular bisector of the second side 202; a center of the green sub-pixel G in the virtual isosceles trapezoid 300 located at the upper right corner is located on the perpendicular bisector of the third side 203; a center of the green sub-pixel G in the virtual isosceles trapezoid 300 located at the lower left corner is located on the perpendicular bisector of the fourth side 204. Further, the four green sub-pixels G in the first virtual polygon 10 are mirror symmetric with respect to S1 as a symmetry axis.

In some embodiments, distances between the center of the green sub-pixel G and the centers of the two blue sub-pixels B within any virtual isosceles trapezoid 300 are substantially equal to each other. Alternatively, distances between the center of the green sub-pixel G and the centers of the two blue sub-pixels B may be different from each other according to a size of the pixel array. It should be noted that in the embodiment of the present disclosure, two items are substantially equal to each other, which means that they are equal to each other, or a difference between them is within a preset range.

Figure 8:
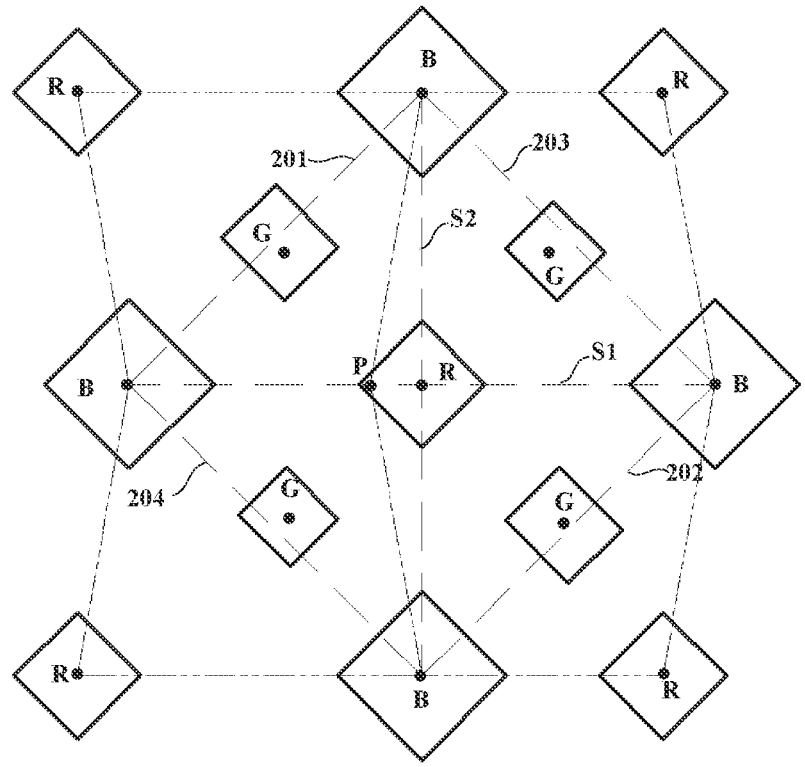
FIG. 8 is a schematic diagram of an arrangement of sub-pixels in a first virtual polygon according to an embodiment of the present disclosure.

In another example, FIG. 8 is a schematic diagram of another first virtual polygon 10 of an embodiment of the present disclosure; as shown in FIG. 8, the first virtual polygon 10 has substantially the same pixel arrangement as the first virtual polygon 10 shown in FIG. 4, and the difference therebetween is only in the arrangement of the green sub-pixels G. In FIG. 8, the four green sub-pixels G also have two sizes, wherein the green sub-pixels G in the same row (the same second pixel group 2) have different sizes, and the green sub-pixels G in the same column (the same fourth pixel group) have different sizes. The shapes, sizes and arrangement of the red sub-pixels R and the blue sub-pixels B in the first virtual polygon 10 are the same as those in FIG. 4, and therefore, the description thereof is not repeated herein.

Figure 9:
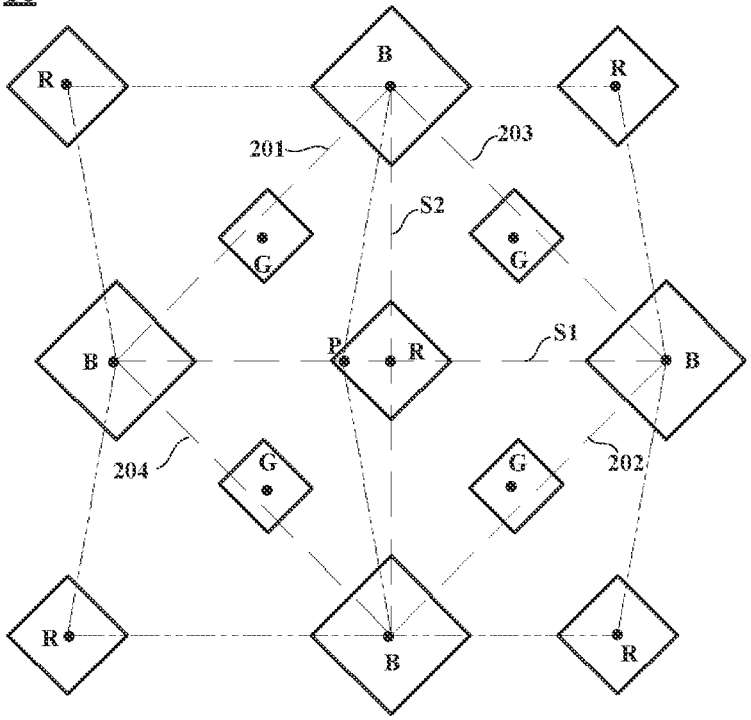
FIG. 9 is a schematic diagram of an arrangement of sub-pixels in a first virtual polygon according to an embodiment of the present disclosure.

In another example, FIG. 9 is a schematic diagram of another first virtual polygon 10 of an embodiment of the present disclosure; as shown in FIG. 9, the first virtual polygon 10 has substantially the same pixel arrangement as the first virtual polygon 10 shown in FIG. 4, and the difference therebetween is only in sizes of the green sub-pixels G. In the first virtual polygon 10 shown in FIG. 9, the four green sub-pixels G have the same size. The shapes, sizes and arrangement of the red sub-pixels R and the blue sub-pixels B in the first virtual polygon 10 are the same as those in FIG. 4, and therefore, the description thereof is not repeated herein.

Figure 10:
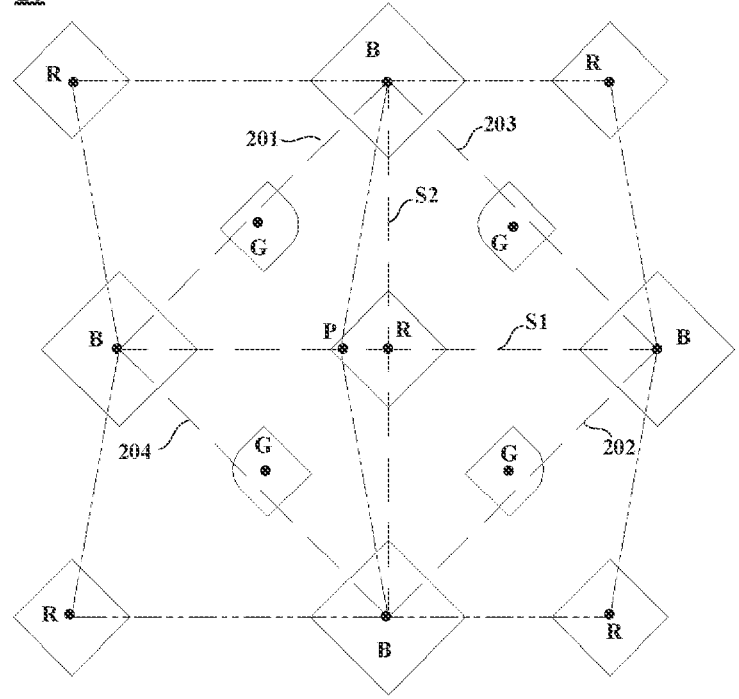
FIG. 10 is a schematic diagram of an arrangement of sub-pixels in a first virtual polygon according to an embodiment of the present disclosure.

In another example. FIG. 10 is a schematic diagram of another first virtual polygon 10 of an embodiment of the present disclosure; as shown in FIG. 10, the first virtual polygon 10 has substantially the same pixel arrangement as the first virtual polygon 10 shown in FIG. 9, and the difference therebetween is only in shapes of the green sub-pixels G. A corner of the green sub-pixel G in the first virtual polygon 10 is a round chamfer. Alternatively, a corner of the green sub-pixel G in the first virtual polygon 10 may also be a flat chamfer. A side of the green sub-pixel G may also be an arc, that is, the green sub-pixel G is fan-shaped. Further, the four green sub-pixels G are mirror symmetric with respect to S2 as a symmetry axis. For example: orientations of the round chamfers of the two green sub-pixels G located in the same column are different, wherein the round chamfers of the two green sub-pixels G in one row are arranged facing to each other, and the round chamfers of the two green sub-pixels G in the other row are arranged facing away from each other. It should be understood that, the four green sub-pixels G of the first virtual polygon 10 are not limited to the arrangement described above, and in the embodiment of the present disclosure, as long as orientations of the first corners of the adjacent green sub-pixels G in the same second pixel group 2 are different; orientations of the first corners of the adjacent green sub-pixels G in the same fourth pixel group 4 are different; and the second sub-pixels G in the adjacent fourth pixel groups 4 are axisymmetric with respect to the column direction as a symmetry axis. For example: the first corner of one of the adjacent green sub-pixels G in the second pixel group 2 faces left and the first corner of the other one faces right, while the first corner of one of the adjacent green sub-pixels G in the fourth pixel group 4 faces left and the first corner of the other one faces right. Further, the first corners of the adjacent green sub-pixels G in the same second pixel group 2 are oriented substantially oppositely; the first corners of the adjacent green sub-pixels G in the same fourth pixel group 4 are oriented substantially oppositely. It should be noted that, the "substantially oppositely" here means opposite angles of a defining quadrangle corresponding to the green sub-pixel G, where one green sub-pixel G is one of the opposite angles, and the other green sub-pixel G is the other opposite angle. Alternatively, lines connecting the virtual centers of the two green sub-pixels G to the first corner are substantially opposite to each other. For example, a reverse extended line of a line connecting the virtual center of one of the two green sub-pixels G to the first corner is substantially parallel to a line connecting the virtual center of the other green sub-pixel G to the first corner, or the angle therebetween is less than 30°.

The shapes, sizes and arrangement of the red sub-pixels R and the blue sub-pixels B in the first virtual polygon 10 in FIG. 10 are the same as those in FIG. 9, and therefore, the description thereof is not repeated.

Figure 11:
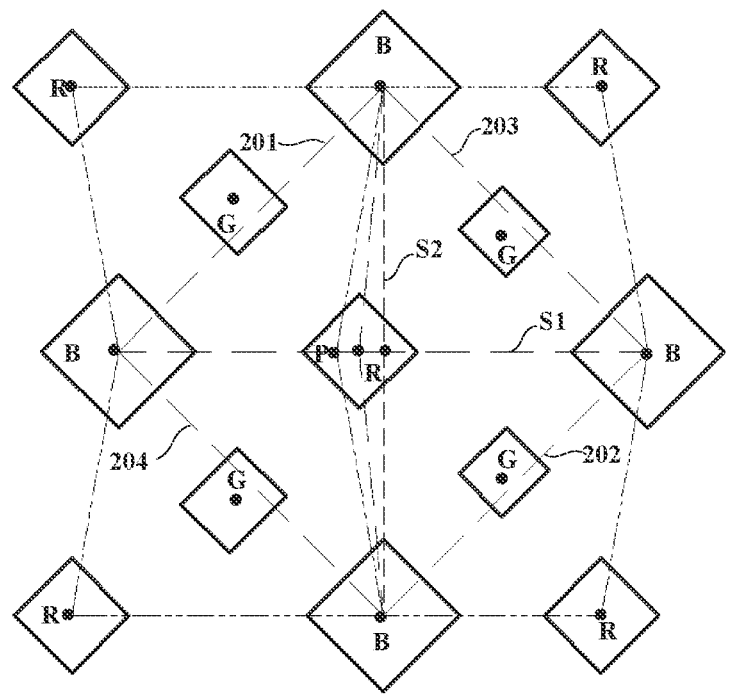
FIG. 11 is a schematic diagram of an arrangement of sub-pixels in a first virtual polygon according to an embodiment of the present disclosure.

In another example, FIG. 11 is a schematic diagram of another first virtual polygon 10 of an embodiment of the present disclosure; as shown in FIG. 11, the first virtual polygon 10 has substantially the same pixel arrangement as the first virtual polygon 10 shown in FIG. 4, except that the center of the red sub-pixel R is located at a different position, the center of the red sub-pixel located in the first virtual polygon 10 is not located at the center of the third virtual quadrangle 200, but the center of the red sub-pixel R is located on S1. If distances between the four green sub-pixels G and the red sub-pixel R are equal to each other, the positions of the four green sub-pixels G are also changed compared with the green sub-pixels G in FIG. 4 accordingly, but the sizes and shapes of the red sub-pixels R, the green sub-pixels G, and the blue sub-pixels B are the same as those in the first virtual polygon 10 shown in FIG. 4, and the description thereof is not repeated here.

In another example, FIG. 12 is a schematic diagram of another first virtual polygon 10 of an embodiment of the present disclosure; as shown in FIG. 12, the first virtual polygon 10 has substantially the same pixel arrangement as the first virtual polygon 10 shown in FIG. 8, except that the center of the red sub-pixel R is located at a different position, the center of the red sub-pixel located in the first virtual polygon 10 is not located at the center of the third virtual quadrangle 200, but the center of the red sub-pixel R is located on S1. If distances between the four green sub-pixels G and the red sub-pixel R are equal to each other, the positions of the four green sub-pixels G are also changed compared with the green sub-pixels G in FIG. 8 accordingly, but the sizes and shapes of the red sub-pixels R, the green sub-pixels G. and the blue sub-pixels B are the same as those in the first virtual polygon 10 shown in FIG. 8, and the description thereof is not repeated here.

Figure 13:
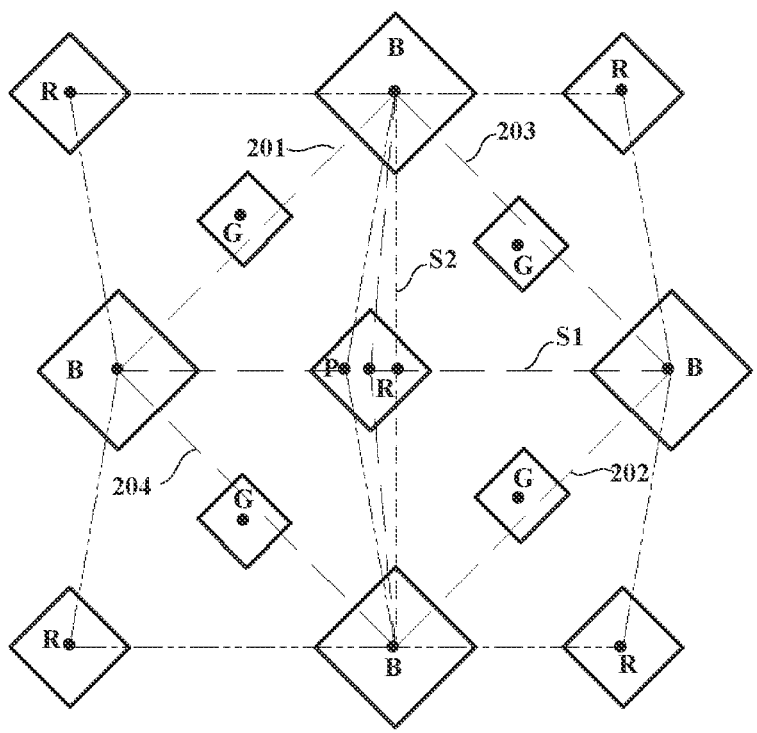
FIG. 13 is a schematic diagram of an arrangement of sub-pixels in a first virtual polygon according to an embodiment of the present disclosure.

In another example, FIG. 13 is a schematic diagram of another first virtual polygon 10 of an embodiment of the present disclosure; as shown in FIG. 13, the first virtual polygon 10 has substantially the same pixel arrangement as the first virtual polygon 10 shown in FIG. 9, except that the center of the red sub-pixel R is located at a different position, the center of the red sub-pixel located in the first virtual polygon 10 is not located at the center of the third virtual quadrangle 200, but the center of the red sub-pixel R is located on S1. If distances between the four green sub-pixels G and the red sub-pixel R are equal to each other, the positions of the four green sub-pixels G are also changed compared with the green sub-pixels G in FIG. 9 accordingly, but the sizes and shapes of the red sub-pixels R, the green sub-pixels G, and the blue sub-pixels B are the same as those in the first virtual polygon 10 shown in FIG. 9, and the description thereof is not repeated here.

Figure 14:
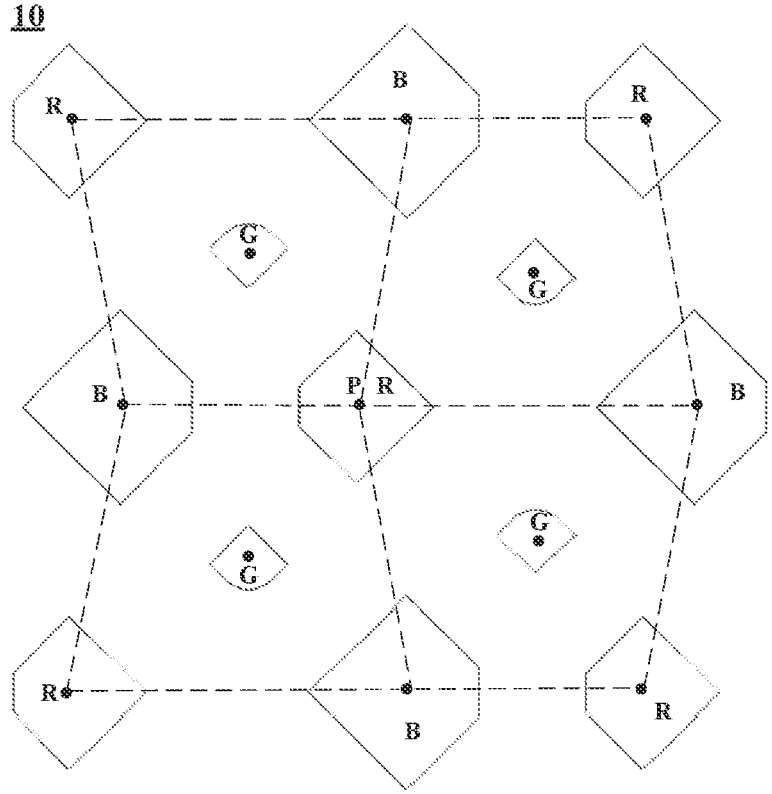
FIG. 14 is a schematic diagram of an arrangement of sub-pixels in a first virtual polygon according to an embodiment of the present disclosure.

In another example, FIG. 14 is a schematic diagram of another first virtual polygon 10 in the embodiment of the present disclosure, and as shown in FIG. 14, four second virtual quadrangles 100 forming the first virtual polygon 10 are virtual isosceles trapezoids 300, that is, the first virtual point P is located at the virtual center of the red sub-pixel R in the first virtual polygon 10. Specifically, each of the red sub-pixels R, the green sub-pixels G and the blue sub-pixels B in the first virtual polygon 10 have a first corner; wherein the first corners of the red and blue sub-pixels R and B are both flat chamfers, and the green sub-pixels G are fan-shaped. Alternatively, the first corners of the red and blue sub-pixels R and B may be round chamfers, and the green sub-pixel G may be a polygonal shape with the first corner. In FIG. 14, as an example, a case will be only described in which the first corners of the red and blue sub-pixels R and B are both flat chamfers, and the green sub-pixels G are fan-shaped. The pixel array in the embodiment of the present disclosure may be divided into a plurality of fourth virtual quadrangles 400, and any one of the virtual quadrangles includes two adjacently disposed green sub-pixels G located in the same column (fourth pixel group 4) and two adjacently disposed red sub-pixels R and blue sub-pixels B located in the same row (first pixel group 1). An extending direction of a line connecting apexes of arcs of the two green sub-pixels G in the fourth virtual quadrangle 400 is parallel to the column direction, and the two green sub-pixels G are mirror symmetric with respect to the row direction as a symmetry axis. For example: the first corner of one green sub-pixel G faces upwards and an arc of the other green sub-pixel G projects downwards. The first corners of the red sub-pixel R and the blue sub-pixel B in the fourth virtual quadrangle 400 are disposed opposite to each other. The first corner of the red sub-pixel R and the first corner of the blue sub-pixel B in each fourth virtual quadrangle 400 are disposed opposite to each other. For example: the first corner of the red sub-pixel R faces right and the first corner of the blue sub-pixel B faces left. In the embodiment of the present disclosure, the red sub-pixel R, the green sub-pixel G, and the blue sub-pixel B in the fourth virtual quadrangle 400 are arranged so that the green sub-pixel G in the fourth virtual quadrangle 400 is as close as possible to the red sub-pixel R and the blue sub-pixel B. Therefore, the total aperture ratio of the pixels may be increased, and the distribution of the green sub-pixel G may be more uniform. Further, the display effect of the display device of the embodiment of the present disclosure may be effectively improved, the display fineness is improved, and the edge jaggy feeling and the display graininess are reduced.

With continued reference to FIG. 14, lines connecting virtual centers of the red sub-pixels R and the blue sub-pixels B in the same row (the first pixel group 1) are substantially on the same straight line, and distances between the red sub-pixel R and two blue sub-pixels B adjacent to the red sub-pixel R are different from each other. For example: the first corner of one red sub-pixel R is opposite to the first corner of one blue sub-pixel B, and the opposite angle of the first corner of the red sub-pixel R may be opposite to the opposite angle of the first corner of another blue sub-pixel B. and in this case, a distance between the red sub-pixel R and the blue sub-pixel B with the first corners of the red and blue sub-pixels R and B opposite to each other is smaller than a distance between the red sub-pixel R and the blue sub-pixel B with the opposite angles of the first corners of the red and blue sub-pixels R and B opposite to each other. Alternatively, in the pixel array, distances between the blue sub-pixel B and two red sub-pixels R adjacent to the blue sub-pixel B in the same row are different from each other. As shown in FIG. 14, lines connecting the virtual centers of the red sub-pixels R and the blue sub-pixels B in the same column (third pixel group 3) are not on the same straight line, but lines connecting the virtual centers of the red sub-pixels R in the same column may be substantially on the same straight line, and lines connecting the virtual centers of the blue sub-pixels B in the same column may be substantially on the same straight line. It should be understood that the arrangement of the red sub-pixels R and the blue sub-pixels B in the first pixel group 1 and the arrangement of the red sub-pixels R and the blue sub-pixels B in the third pixel group 3 may be interchanged. That is, lines connecting the virtual centers of the red sub-pixels R and the blue sub-pixels B in the same column (third pixel group 3) are substantially on the same straight line, and the distances between the red sub-pixel R and the two blue sub-pixels B adjacent to the red sub-pixel R are different from each other; lines connecting the virtual centers of the red sub-pixels R and the blue sub-pixels B in the same row (first pixel group) are not on the same straight line, but lines connecting the virtual centers of the red sub-pixels R in the same column may be substantially on the same straight line, and lines connecting the virtual centers of the blue sub-pixels B in the same column may be substantially on the same straight line.

In some embodiments, the closest distance between the pixel apertures of adjacent green sub-pixels G is greater than the closest distance between the pixel apertures of adjacent red and blue sub-pixels R and B. As such, the green sub-pixels G and the red and blue sub-pixels R and B are more compact to increase the overall aperture ratio of the pixel.

Figure 15:
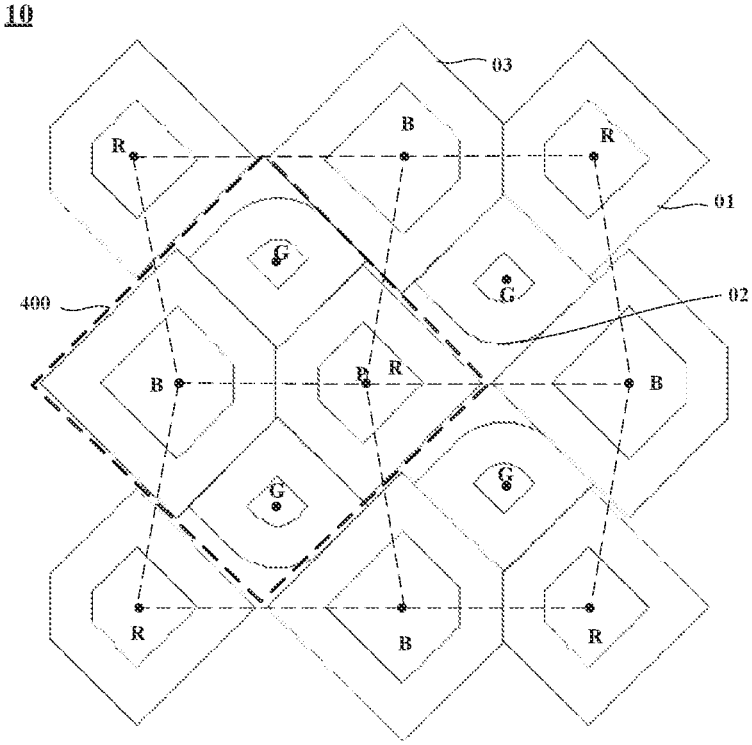
FIG. 15 is a schematic diagram of light emitting regions of sub-pixels in the first virtual polygon of FIG. 14.
Figure 16:
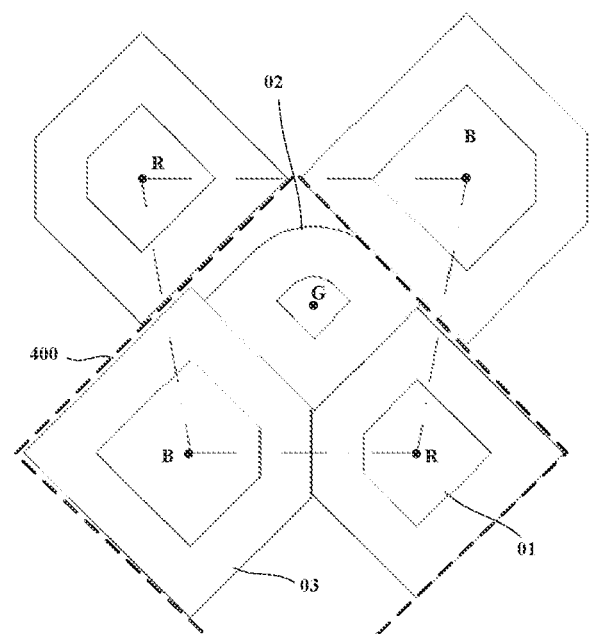
FIG. 16 is a schematic diagram illustrating a distribution of light emitting regions of sub-pixels of a fourth virtual quadrangle in the first virtual polygon of FIG. 14.

In some embodiments, FIG. 15 is a schematic diagram of light emitting regions of sub-pixels in the first virtual polygon of FIG. 14. As shown in FIG. 15, each sub-pixel has a respective light emitting layer, and a shape of the light emitting layer of each sub-pixel is substantially the same as or identical to the shape of each sub-pixel (or a pixel aperture of the sub-pixel). That is, a shape of a light emitting layer 01 of the red sub-pixel R is the same as that of the red sub-pixel R; a shape of a light emitting layer 01 of the green sub-pixel G is the same as that of the green sub-pixel G; a shape of a light emitting layer 03 of the blue sub-pixel B is the same as that of the blue sub-pixel B. The light emitting layer of the green sub-pixel G within each virtual isosceles trapezoid 300 is located within a region defined by the light emitting layers of the two red sub-pixels R and the light emitting layers of the two blue sub-pixels B at the vertex angle of the first virtual isosceles trapezoid. FIG. 16 is a schematic diagram showing a distribution of light emitting regions of sub-pixels of a fourth virtual quadrangle 400 in the first virtual polygon 10 of FIG. 14. As shown in FIG. 16, boundaries of light emitting layers of respective sub-pixels located within the fourth virtual quadrangle 400 are at least partially in contact with each other. Further, a boundary of the light emitting layer 02 of each green sub-pixel G is in contact with a boundary of the light emitting layer 01 of the red sub-pixel R and a boundary of the light emitting layer 03 of the blue sub-pixel B in the same virtual isosceles trapezoid 300 and in the same fourth virtual quadrangle 400. Therefore, the green sub-pixel G may be close to the red sub-pixel R and the blue sub-pixel B as much as possible, so that the total aperture ratio of the pixel may be improved, and the distribution of the green sub-pixels G is more uniform.

Figure 17:
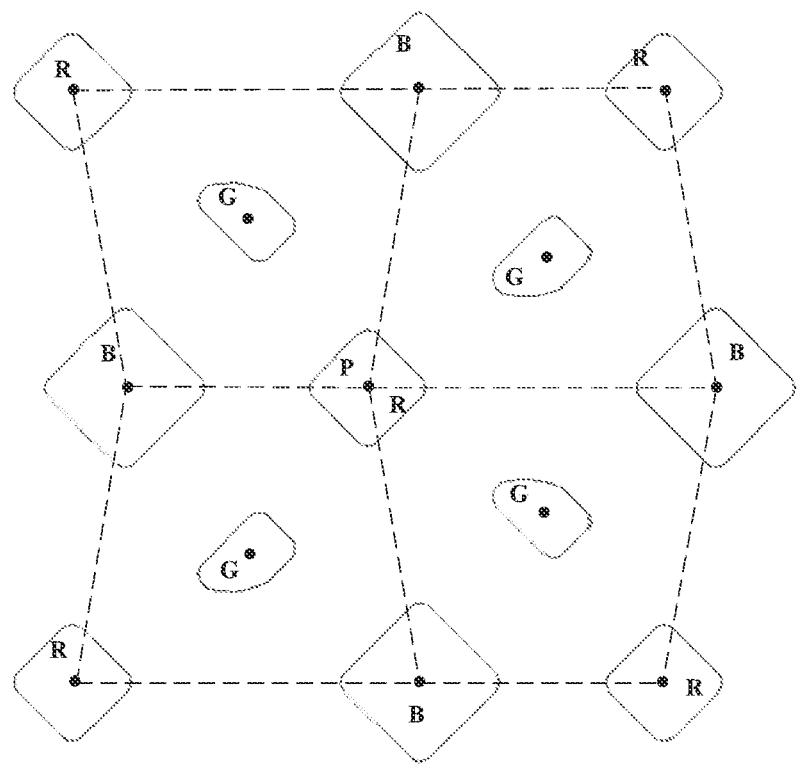
FIG. 17 is a schematic diagram of an arrangement of sub-pixels in a first virtual polygon according to an embodiment of the present disclosure.

In another example, FIG. 17 is a schematic diagram of another first virtual polygon 10 in the embodiment of the present disclosure, as shown in FIG. 17, a red sub-pixel R and a blue sub-pixel B in the first virtual polygon 10 are rectangular (or square) in shape, a green sub-pixel G is a polygon with a first corner, the first corner of the green sub-pixel may be a flat chamfer or a round chamfer. As an example, the first corner of the green sub-pixel G is a round chamfer in FIG. 17. The arrangement of the sub-pixels in FIG. 17 is the same as that in FIG. 15, and therefore, the description thereof is not repeated.

Figure 18:
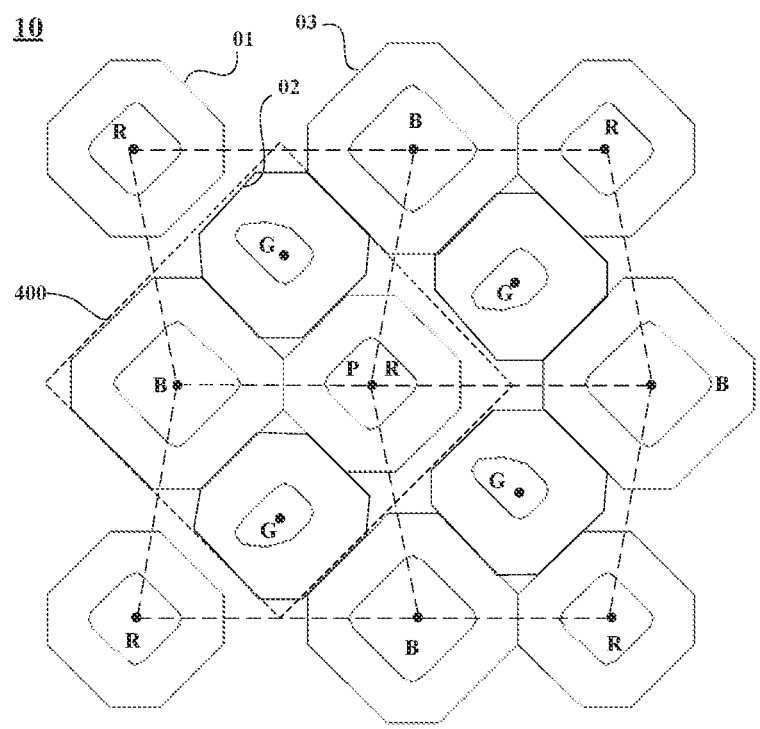
FIG. 18 is a schematic diagram of light emitting regions of sub-pixels in the first virtual polygon of FIG. 17.

In some embodiments, FIG. 18 is a schematic diagram of light emitting regions of sub-pixels in the first virtual polygon 10 of FIG. 17. As shown in FIG. 18, each sub-pixel has a respective light emitting layer, and shapes of light emitting layers of respective sub-pixels are same. That is, a shape of a light emitting layer 01 of the red sub-pixel R, a shape of a light emitting layer 02 of the green sub-pixel G and a shape of a light emitting layer 03 of the blue sub-pixel B are the same. For example, a shape of each light emitting layer is rectangular (or square). The light emitting layer of the green sub-pixel G within each virtual isosceles trapezoid 300 is located within a region defined by the light emitting layers 01 of the two red sub-pixels R and the light emitting layers 03 of the two blue sub-pixels B at the vertex angle of the first virtual isosceles trapezoid. Boundaries of light emitting layers of respective sub-pixels located within the fourth virtual quadrangle 400 are at least partially in contact with each other. Further, a boundary of the light emitting layer 02 of each green sub-pixel G is in contact with a boundary of the light emitting layer 01 of the red sub-pixel R and a boundary of the light emitting layer 03 of the blue sub-pixel B in the same virtual isosceles trapezoid and in the same fourth virtual quadrangle 400. Therefore, the green sub-pixel G may be close to the red sub-pixel R and the blue sub-pixel B as much as possible, so that the total aperture ratio of the pixel may be improved, and the distribution of the green sub-pixels G is more uniform.

Figure 19:
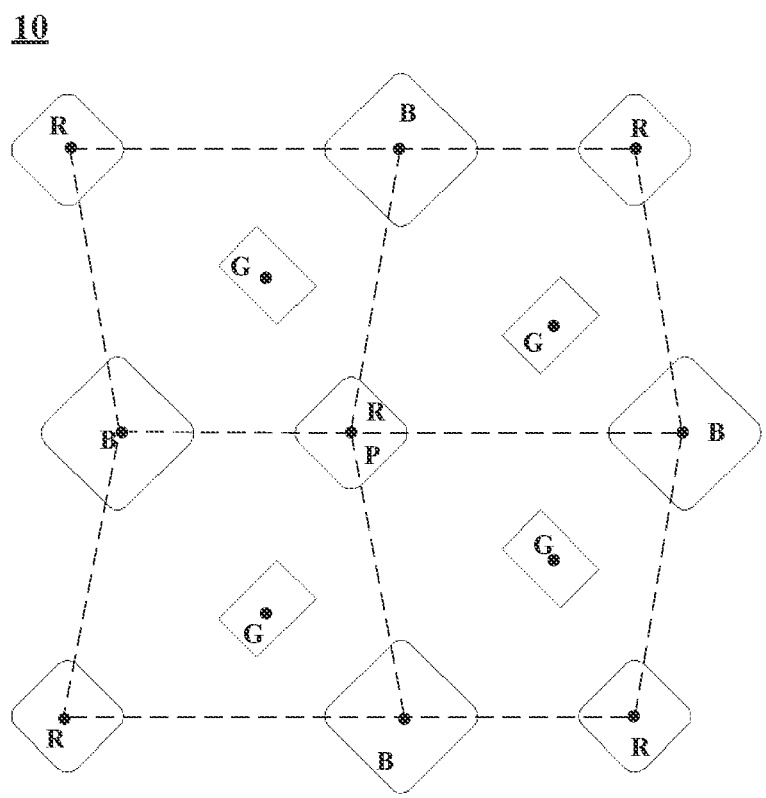
FIG. 19 is a schematic diagram of an arrangement of sub-pixels in a first virtual polygon according to an embodiment of the present disclosure.

In another example. FIG. 19 is a schematic diagram of another first virtual polygon 10 in the embodiment of the present disclosure, and as shown in FIG. 19, the arrangement of sub-pixels in the first virtual polygon 10 is the same as that of in FIG. 17, except that the red sub-pixel R and the blue sub-pixel B in the first virtual polygon 10 are rectangular (or square) in shape. The arrangement of the sub-pixels in FIG. 19 is the same as that in FIG. 17, and therefore, the description thereof is not repeated.

Figure 20:
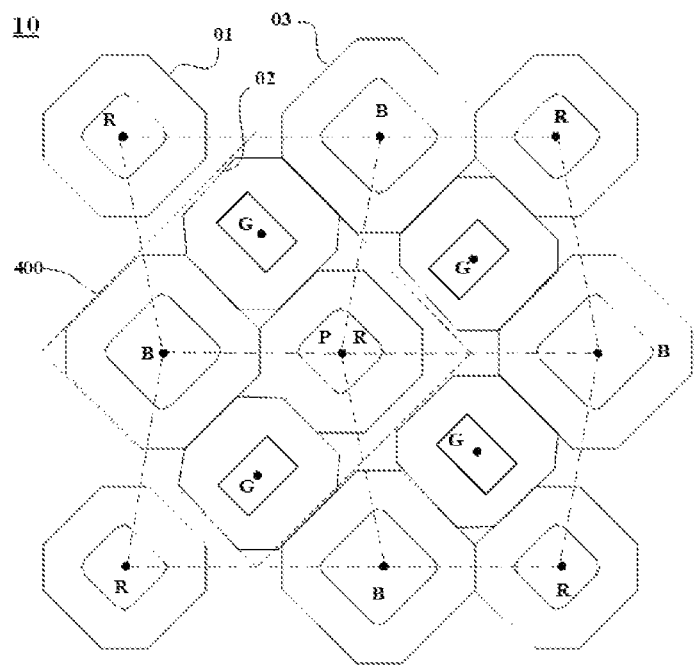
FIG. 20 is a schematic diagram of light emitting regions of sub-pixels in the first virtual polygon of FIG. 19.

In some embodiments, FIG. 20 is a schematic diagram of light emitting layers of sub-pixels in the first virtual polygon 10 of FIG. 19. As shown in FIG. 20, a shape of the light emitting layer of each sub-pixel is substantially the same as or identical to the shape of each sub-pixel (or a pixel aperture of the sub-pixel). That is, a shape of a light emitting layer 01 of the red sub-pixel R is the same as that of the red sub-pixel R; a shape of a light emitting layer 01 of the green sub-pixel G is the same as that of the green sub-pixel G; a shape of a light emitting layer 03 of the blue sub-pixel B is the same as that of the blue sub-pixel B. The arrangement of the light emitting layers of the sub-pixels is the same as that of the light emitting layers in FIG. 18, and thus the description thereof is not repeated.

Figure 21:
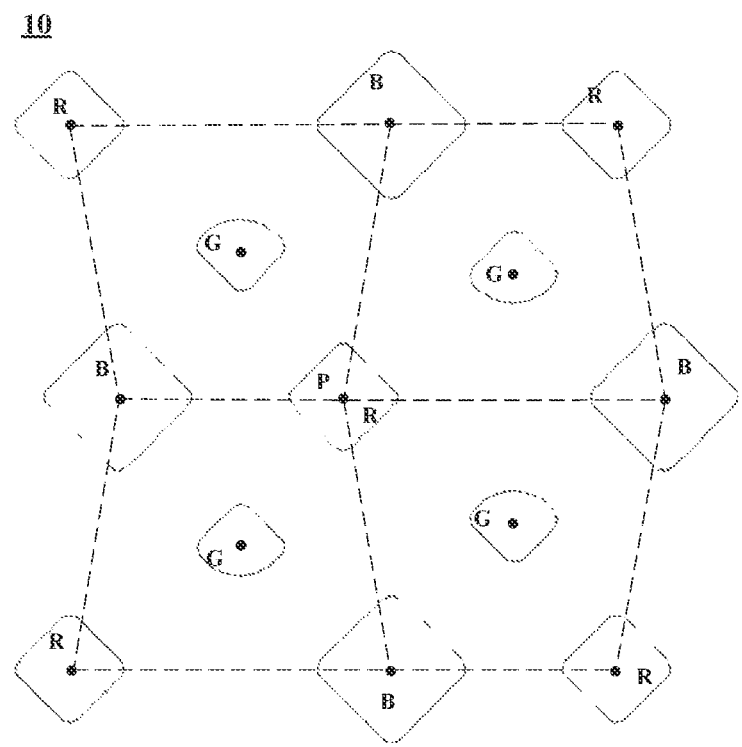
FIG. 21 is a schematic diagram of an arrangement of sub-pixels in a first virtual polygon according to an embodiment of the present disclosure.

In another example, FIG. 21 is a schematic diagram of another first virtual polygon 10 in the embodiment of the present disclosure, and as shown in FIG. 21, the arrangement of sub-pixels in the first virtual polygon 10 is the same as that of in FIG. 19, except that the shape of the green sub-pixel G in the first virtual polygon 10 is fan-shaped. The arrangement of the sub-pixels in FIG. 21 is the same as that in FIG. 19, and therefore, the description thereof is not repeated.

Figure 22:
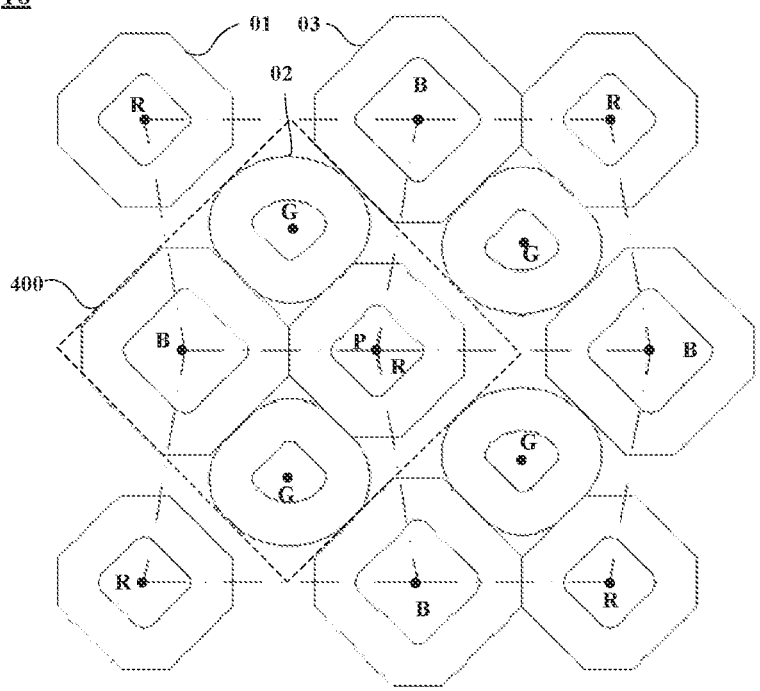
FIG. 22 is a schematic diagram of light emitting regions of sub-pixels in the first virtual polygon of FIG. 21.

In some embodiments, FIG. 22 is a schematic diagram of light emitting layers of sub-pixels in the first virtual polygon 10 of FIG. 21. As shown in FIG. 22, a shape of the light emitting layer of each sub-pixel is substantially the same as or identical to the shape of each sub-pixel (or a pixel aperture of the sub-pixel). That is, a shape of a light emitting layer 01 of the red sub-pixel R is the same as that of the red sub-pixel R; a shape of a light emitting layer 01 of the green sub-pixel G is the same as that of the green sub-pixel G; a shape of a light emitting layer 03 of the blue sub-pixel B is the same as that of the blue sub-pixel B. In this case, the light emitting layer 01 of the green sub-pixel G within each virtual isosceles trapezoid is located within a region defined by the light emitting layers 01 of the two red sub-pixels R and the light emitting layers 03 of the two blue sub-pixels B at the vertex angle of the first virtual isosceles trapezoid. Boundaries of respective sub-pixels within the fourth virtual quadrangle are in contact with each other.

Figure 23:
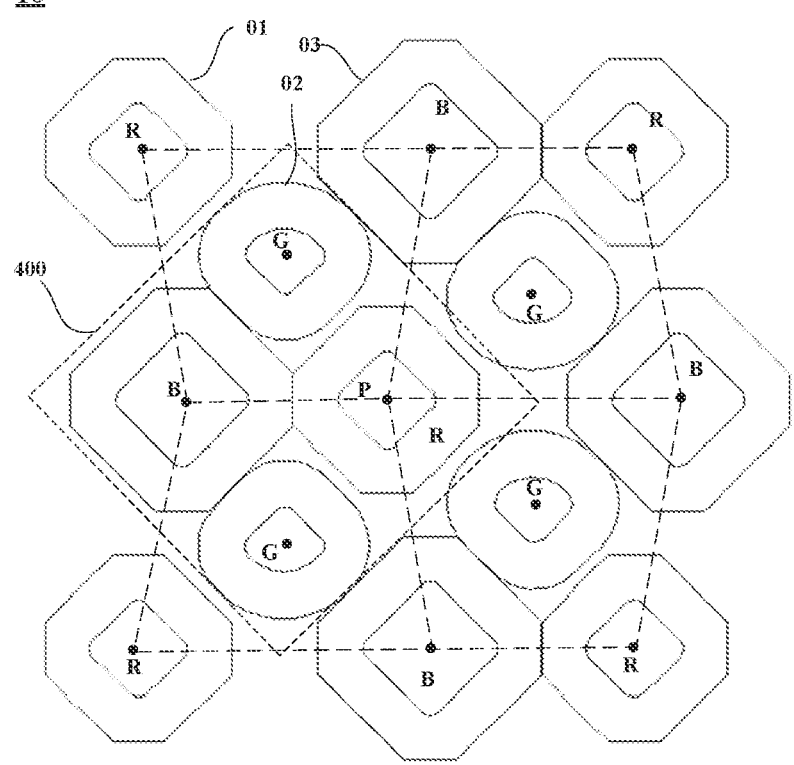
FIG. 23 is a schematic diagram of light emitting regions of sub-pixels in the first virtual polygon of FIG. 21.

In some embodiments, FIG. 23 is a schematic diagram of light emitting layers of sub-pixels in the first virtual polygon 10 of FIG. 21; as shown in FIG. 23, a shape of the light emitting layer of each sub-pixel is substantially the same as or identical to the shape of each sub-pixel (or a pixel aperture of the sub-pixel). That is, a shape of a light emitting layer 01 of the red sub-pixel R is the same as that of the red sub-pixel R; a shape of a light emitting layer 01 of the green sub-pixel G is the same as that of the green sub-pixel G; a shape of a light emitting layer 03 of the blue sub-pixel B is the same as that of the blue sub-pixel B. In this case, the light emitting layer 01 of the green sub-pixel G within each virtual isosceles trapezoid is located within a region defined by the light emitting layers 01 of the two red sub-pixels R and the light emitting layers 03 of the two blue sub-pixels B at the vertex angle of the first virtual isosceles trapezoid. A boundary of the light emitting layer 02 of the green sub-pixel G is in contact with boundaries of the light emitting layers 03 of the two blue sub-pixels B.

Figure 24:
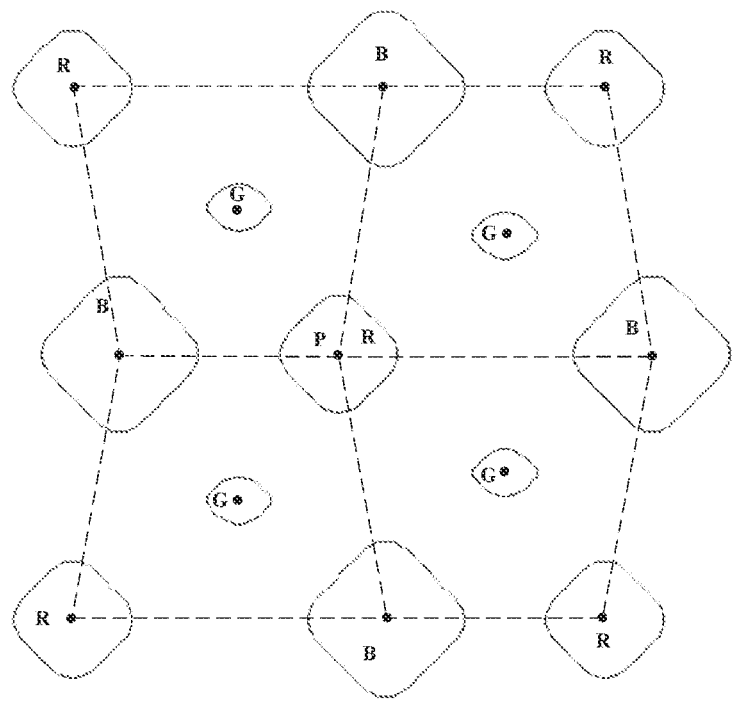
FIG. 24 is a schematic diagram of an arrangement of sub-pixels in a first virtual polygon according to an embodiment of the present disclosure.

In another example, FIG. 24 is a schematic diagram of another first virtual polygon 10 in the embodiment of the present disclosure, and as shown in FIG. 24, the arrangement of sub-pixels in the first virtual polygon 10 is the same as that in FIG. 21, except that the green sub-pixel G in the first virtual polygon 10 has an ellipse shape. The arrangement of the sub-pixels in FIG. 24 is the same as that in FIG. 21, and therefore, the description thereof is not repeated.

Figure 25:
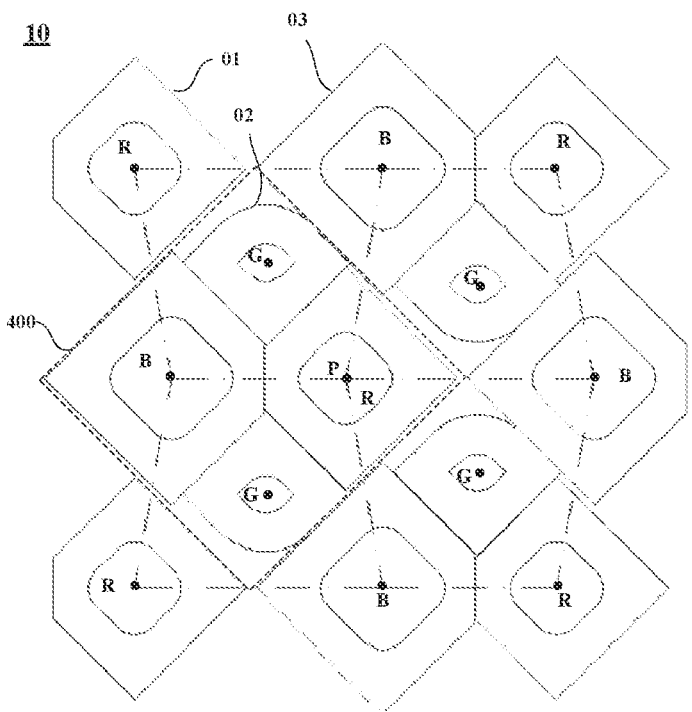
FIG. 25 is a schematic diagram of light emitting regions of sub-pixels in the first virtual polygon of FIG. 24.

In some embodiments, FIG. 25 is a schematic diagram of light emitting layers of sub-pixels in the first virtual polygon 10 of FIG. 24; as shown in FIG. 25, the shape of the light emitting layer of respective sub-pixels is different from the shape of the corresponding sub-pixel. For example: the shape of the light emitting layer of respective sub-pixels is the same as that of the light emitting layer in FIG. 25, and the arrangement of the light emitting layer of respective sub-pixels is the same as that of the light emitting layer in FIG. 15, the description thereof is not repeated.

In the embodiment of the present disclosure, by adjusting the position relationship among the red sub-pixel R, the green sub-pixel G, and the blue sub-pixel B, and adjusting the shapes and sizes of the red sub-pixel R, the green sub-pixel G, and the blue sub-pixel B, and the light emitting layer, the display panel provided with the pixel array of the embodiment of the present disclosure has a better display effect, an improved display fineness, and a reduced edge jaggy feeling and display graininess.

In a second aspect, an embodiment of the present disclosure further provides a display device, which includes the above pixel array provided in the embodiments of the present disclosure. The display device may be: any product or component with a display function, such as a mobile phone, a tablet computer, a television, a display, a notebook computer, a digital photo frame, a navigator and the like.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A pixel array, comprising a plurality of sub-pixels, each sub-pixel of the plurality of sub-pixels has a virtual pixel center, a width direction and a length direction of the sub-pixel are used as a width extending direction and a length extending direction of a defining quadrangle, respectively, and a width and a length of the sub-pixel are used as a width and a length of the defining quadrangle, respectively, and an intersection of diagonal lines of the defining quadrangle is used as the virtual pixel center; the plurality of sub-pixels comprise first sub-pixels, second sub-pixels, and third sub-pixels; the first sub-pixels and the third sub-pixels are alternately arranged along a first direction to form first pixel groups; the second sub-pixels are arranged side by side along the first direction to form second pixel groups; the first sub-pixels and the third sub-pixels are alternately arranged along a second direction to form third pixel groups; the second sub-pixels are arranged side by side along the second direction to form fourth pixel groups; the first pixel groups and the second pixel groups are alternately arranged along the second direction; the third pixel groups and the fourth pixel groups are arranged alternately along the first direction; wherein, virtual centers of two first sub-pixels and two third sub-pixels in two adjacent first pixel groups and two adjacent third pixel groups are sequentially connected to form a second virtual quadrangle; a first virtual polygon comprises four second virtual quadrangles in an array and sharing adjacent sides; and the first sub-pixels and the third sub-pixels are at vertex angles or sides of the first virtual polygon and are alternately arranged on the vertex angles or the sides of the first virtual polygon along the clockwise direction;

the first virtual polygon has a first virtual point therein, lines connecting the first virtual point and virtual centers of the four third sub-pixels on the first virtual polygon divide the first virtual polygon into four virtual isosceles trapezoids;

wherein the virtual centers of four third sub-pixels in the first virtual polygon are sequentially connected to form a third virtual quadrangle;

the first virtual point is on a diagonal line of the third virtual quadrangle; and/or a virtual center of the first sub-pixel within the first virtual polygon is on a diagonal line of the third virtual quadrangle;

a virtual center of the first sub-pixel within the first virtual polygon is on a center of the third virtual quadrangle; and the first virtual point within the first virtual polygon and the virtual center of the first sub-pixel are located at different positions on a same diagonal line of the third virtual quadrangle.

2. The pixel array of claim 1, wherein the third virtual quadrangle comprises a square.

3. The pixel array of claim 1, wherein the third virtual quadrangle has a first side and a second side opposite to each other, and a third side and a fourth side opposite to each other; two second sub-pixels in the virtual isosceles trapezoid and on the first side and the second side are symmetric with respect to a straight line, which passes through a center of the third side and is parallel to the first side, as a symmetry axis; and/or two second sub-pixels located in the virtual isosceles trapezoid and on the third side and the fourth side are symmetric with respect to a straight line, which passes through a center of the first side and is parallel to the third side, as a symmetry axis.

4. The pixel array of claim 1, wherein the second sub-pixels in a same second and/or fourth pixel group have different sizes; or the second sub-pixels within a same first virtual polygon have a same size; or the second sub-pixel comprises at least one vertex angle, a distance from a vertex of each of the at least one vertex angle to the virtual center of the second sub-pixel is different from a distance from a vertex of any other vertex angle of the second sub-pixel to the virtual center of the second sub-pixel; or the virtual center of the second sub-pixel in the virtual isosceles trapezoid is on a perpendicular bisector of a line connecting virtual centers of two third sub-pixels on the virtual isosceles trapezoid; or distances between the virtual center of the second sub-pixel in the virtual isosceles trapezoid and the virtual centers of two third sub-pixels on the virtual isosceles trapezoid are substantially the same; or distances between a first sub-pixel in the first pixel group and two third sub-pixels adjacent to the first sub-pixel are different from each other.

5. The pixel array of claim 1, wherein the second sub-pixels comprise first corners, a distance from a vertex of the first corner of the second sub-pixel to the virtual center of the second sub-pixel is smaller than a distance from a vertex of an angle opposite to the first corner of the second sub-pixel to the virtual center of the second sub-pixel; a line connecting vertexes of first corners of the second sub-pixels in a same fourth pixel group is substantially parallel to the second direction;

first corners of adjacent second sub-pixels in a same second pixel group have different orientations; first corners of adjacent second sub-pixels in a same fourth pixel group have different orientations; and four second sub-pixels in the first virtual polygon are symmetric with respect to a line connecting virtual centers of two third sub-pixels in the third pixel group in the first virtual polygon, as a symmetry axis.

6. The pixel array of claim 5, wherein first corners of adjacent second sub-pixels in a same second pixel group have substantially opposite orientations; and first corners of adjacent second sub-pixels in a same fourth pixel group have substantially opposite orientations.

7. The pixel array of claim 5, wherein the first sub-pixels and the third sub-pixels all comprise first corners, a distance from a vertex of the first corner of the first sub-pixel to the virtual center of the first sub-pixel is smaller than a distance from a vertex of an angle opposite to the first corner of the first sub-pixel to the virtual center of the first sub-pixel; a distance from a vertex of the first corner of the third sub-pixel to the virtual center of the third sub-pixel is smaller than a distance from a vertex of an angle opposite to the first corner of the third sub-pixel to the virtual center of the third sub-pixel;

the pixel array comprises a plurality of fourth virtual quadrangles which are continuously arranged in the first direction or the second direction, the fourth virtual quadrangle comprises one first sub-pixel, one third sub-pixel and two second sub-pixels at the vertex angles of the fourth virtual quadrangle, the first corner of the first sub-pixel and the first corner of the third sub-pixel face towards each other, and the first corners of the two second sub-pixels face away from each other.

8. The pixel array of claim 7, wherein in a same first pixel group, the first corner of each first sub-pixel and the first corner of one third sub-pixel of two third sub-pixels adjacent to the first sub-pixel face towards each other, and the first corners of the first sub-pixel and the other third sub-pixel of the two third sub-pixels face away from each other, and a distance between the first sub-pixel and the one third sub-pixel is smaller than a distance between the first sub-pixel and the other third sub-pixel.

9. The pixel array of claim 1, wherein the pixel array comprises a base substrate, and a pixel definition layer on the base substrate and having a pixel aperture; the sub-pixel comprises a first electrode between the base substrate and the pixel definition layer, a light emitting layer covering at least the pixel aperture, and a second electrode covering the light emitting layer; and
  boundaries of different light emitting layers of the sub-pixels in a same fourth virtual quadrangle are at least partially in contact with each other.

10. The pixel array of claim 1, wherein the pixel array comprises a base substrate, and a pixel definition layer on the base substrate and having a pixel aperture; the sub-pixel comprises a first electrode between the base substrate and the pixel definition layer, a light emitting layer covering at least the pixel aperture, and a second electrode covering the light emitting layer; and
  the light emitting layer of the second sub-pixel in any virtual isosceles trapezoid is in a region defined by light emitting layers of two first sub-pixels and light emitting layers of two third sub-pixels at vertex angles of the virtual isosceles trapezoid.

11. The pixel array of claim 1, wherein the pixel array comprises a base substrate, and a pixel definition layer on the base substrate and having a pixel aperture; the sub-pixel comprises a first electrode between the base substrate and the pixel definition layer, a light emitting layer covering at least the pixel aperture, and a second electrode covering the light emitting layer; and
  a boundary of the light emitting layer of the second sub-pixel in any virtual isosceles trapezoid is in contact with boundaries of light emitting layers of two third sub-pixels at vertex angles of the virtual isosceles trapezoid.

12. The pixel array of claim 11, wherein a closest distance between pixel apertures of two adjacent second sub-pixels is greater than a closest distance between pixel apertures of the first and third sub-pixels adjacent to each other.

13. The pixel array of claim 1, wherein a base angle of the virtual isosceles trapezoid is $\theta$, where $45°<\theta<135°$.

14. The pixel array of any of claim 13, wherein a ratio of a top side to a bottom side of the isosceles trapezoid is (Pitch+Pitch*cot $\theta$)/(Pitch−Pitch*cot $\theta$); where Pitch is a pixel pitch, which is half of a distance between the virtual centers of two adjacent first sub-pixels in a same first pixel group, or half of a distance between the virtual centers of two adjacent third sub-pixels in a same first pixel group, or a distance between the virtual centers of two adjacent second sub-pixels in a same second pixel group.

15. The pixel array of claim 1, wherein lines connecting virtual centers of the first and third sub-pixels in a same first pixel group are substantially on a same straight line; in a same third pixel group, lines connecting virtual centers of the first sub-pixels are substantially on a same straight line, lines connecting virtual centers of the third sub-pixels are substantially on a same straight line, and lines connecting virtual centers of the first sub-pixels and lines connecting virtual centers of the third sub-pixels are not on a same straight line; and/or lines connecting virtual centers of the first sub-pixels and the third sub-pixels in a same third pixel group are substantially on a same straight line; in a same first pixel group, lines connecting virtual centers of the first sub-pixels are substantially on a same straight line, lines connecting virtual centers of the third sub-pixels are substantially on a same straight line, and lines connecting virtual centers of the first sub-pixels and lines connecting virtual centers of the third sub-pixels are not on a same straight line.

16. A display device comprising the pixel array of claim 1.

17. The pixel array of claim 1, wherein the third virtual quadrangle has a first side and a second side opposite to each other, and a third side and a fourth side opposite to each other; the third virtual quadrangle has a first diagonal line and a second diagonal line; two second sub-pixels in the virtual isosceles trapezoid and on the first side and the third side are symmetric with respect to an extending line of the first diagonal line as a symmetry axis; and/or
  two second sub-pixels in the virtual isosceles trapezoid and on the second side and the fourth side are symmetric with respect to an extending line of the second diagonal line as a symmetric axis.

18. The pixel array of claim 1, wherein distances between the four second sub-pixels in the first virtual polygon to the virtual center of the first sub-pixel within the first virtual polygon are substantially the same.

* * * * *